(12) United States Patent
Igarashi

(10) Patent No.: US 7,329,898 B2
(45) Date of Patent: Feb. 12, 2008

(54) TRANSITION METAL COMPLEX AND LIGHT-EMITTING DEVICE

(75) Inventor: Tatsuya Igarashi, Kanagawa-ken (JP)

(73) Assignee: FUJIFILM Corporation, Tokyo (JP)

( * ) Notice: Subject to any disclaimer, the term of this patent is extended or adjusted under 35 U.S.C. 154(b) by 356 days.

(21) Appl. No.: 11/101,555

(22) Filed: Apr. 8, 2005

(65) Prior Publication Data

US 2005/0238916 A1    Oct. 27, 2005

(51) Int. Cl.
*H01L 51/00* (2006.01)
*H01L 29/08* (2006.01)
*H01L 35/24* (2006.01)
*H01L 29/18* (2006.01)
*H01L 27/15* (2006.01)
*H01L 31/12* (2006.01)
*H01L 33/00* (2006.01)

(52) U.S. Cl. ............... 257/40; 257/87; 257/E51.018; 257/E51.022; 257/E51.043

(58) Field of Classification Search .............. 257/40, 257/87, 89, 102, 103, 79, E51.018, E51.022, 257/E51.043
See application file for complete search history.

(56) References Cited

U.S. PATENT DOCUMENTS

| | | | |
|---|---|---|---|
| 6,355,746 B1 * | 3/2002 | Tagge et al. | 526/133 |
| 6,420,057 B1 * | 7/2002 | Ueda et al. | 428/690 |
| 6,548,836 B1 * | 4/2003 | Rubner et al. | 257/103 |
| 6,565,994 B2 * | 5/2003 | Igarashi | 428/690 |
| 6,569,544 B1 * | 5/2003 | Alain et al. | 428/690 |
| 2002/0028347 A1 * | 3/2002 | Marrocco et al. | 428/690 |
| 2002/0048689 A1 * | 4/2002 | Igarashi et al. | 428/690 |
| 2002/0051893 A1 * | 5/2002 | Gao et al. | 428/690 |
| 2002/0068190 A1 * | 6/2002 | Tsuboyama et al. | 428/690 |
| 2002/0182441 A1 * | 12/2002 | Lamansky et al. | 428/690 |
| 2007/0178333 A1 * | 8/2007 | Igarashi et al. | 428/690 |

OTHER PUBLICATIONS

Baitalik, et al., "mononuclear and Buclear Ruthenium (II) Complexes Containing 2,2'-Bipyridine or 1, 10-Phenanthroline and Pyrazole-3,5-Bis(benzimidazole) . . . " Inorganic Chemistry, 1999 vol. 38, pp. 3296-3308.
U.S. Appl. No. 60/211,108.
U.S. Appl. No. 60/208,434.

* cited by examiner

*Primary Examiner*—Walter Lindsay, Jr.
(74) *Attorney, Agent, or Firm*—Sughrue Mion, Pllc.

(57) ABSTRACT

A light-emitting device comprising a pair of electrodes and one or more organic layers disposed between the electrodes, the one or more organic layers comprising a light-emitting layer. At least one of the organic layers comprises a transition metal complex containing a moiety represented by the following formula (1):

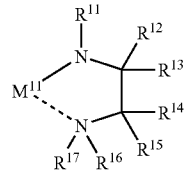

Formula (1)

wherein $M^{11}$ represents a transition metal ion; and $R^{11}$, $R^{12}$, $R^{13}$, $R^{14}$, $R^5$, $R^{16}$ and $R^{17}$ represent a substituent or a single bond, respectively, or a tautomer thereof.

5 Claims, No Drawings

TRANSITION METAL COMPLEX AND LIGHT-EMITTING DEVICE

FIELD OF THE INVENTION

The present invention relates to a light-emitting device that converts electric energy into light to be useful for indicating elements, display devices, backlights, electro-photographies, illumination light sources, recording light sources, exposing light sources, reading light sources, road signs or markings, signboards, interiors, optical communications, etc. The present invention further relates to an iridium complex usable for the light-emitting device.

BACKGROUND OF THE INVENTION

Recently, various display devices have been widely studied. In particular, organic electroluminescence (EL) devices are advantageous in that they can emit light with high luminance by a lowered applying voltage, whereby much attention has been paid thereto. For example, a light-emitting device comprising organic thin layers provided by vapor-depositing organic compounds has been disclosed in Applied Physics Letters, 51, 913 (1987). This light-emitting device has a structure where an electron-transporting material of tris(8-hydroxyquinolinato) aluminum complex (Alq) and a hole-transporting material of an amine compound are disposed between electrodes as a laminate, thereby exhibiting more excellent light-emitting properties than that of conventional light-emitting devices having a single-layer structure.

A green light-emitting device disclosed in Applied Physics Letters, 75, 4 (1999) utilizes a particular ortho-metalated iridium complex, Ir(ppy)$_3$ (Tris-Ortho-Metalated Complex of Iridium (III) with 2-Phenylpyridine), as a light-emitting material to improve light-emitting properties. Although the green light-emitting device exhibits a high external quantum efficiency of approximately 8%, which exceeds that of conventional light-emitting devices, 5%, it has been required to further improve the device with respect to luminance, light-emitting efficiency and durability.

Above-mentioned light-emitting device using Ir(ppy)$_3$ emits only a green light to have a narrow applicability as a display device. Thus, expectations have been high for the development of a light-emitting device that can emit light of the other color with high efficiency. Turning to blue light-emitting devices, though many devices using a distyrylarylene or a derivative thereof such as DPVBi (4,4'-bis(2,2'-diphenylvinyl)-biphenyl) have been proposed, an upper limit of external quantum efficiency has been 5%. Development of a blue light-emitting device exhibiting the external quantum efficiency exceeding 5% has been highly expected because it will contribute for the progress of a color organic EL device and a white light-emitting device excellent in the efficiency.

OBJECT AND SUMMARY OF THE INVENTION

An object of the present invention is to provide a light-emitting device excellent in luminance, light-emitting efficiency and durability that can emit a light of blue, white, etc. Another object of the present invention is to provide a transition metal complex that is usable for the light-emitting device and has a wide applicability for medical treatments, fluorescent whitening agents, photographic materials, UV-absorbing materials, laser dyes, dyes for color filters, color conversion filters, etc.

As a result of intense research in view of the above objects, the inventor has found that a light-emitting device using a transition metal complex with a particular structure can emit light of blue, white, etc. with excellent luminance, light-emitting efficiency and durability. The present invention has been accomplished by the finding.

Thus, a light-emitting device of the present invention comprises a pair of electrodes and one or more organic layers disposed between the electrodes, the one or more organic layers comprising a light-emitting layer, wherein at least one of the one or more organic layers comprises a transition metal complex containing a moiety represented by the following formula (1) or a tautomer thereof.

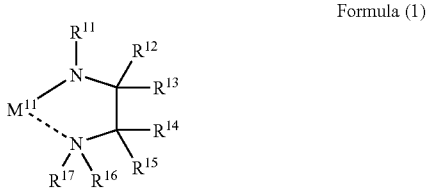

Formula (1)

In the formula (1), $M^{11}$ represents a transition metal ion; and $R^{11}$, $R^{12}$, $R^{13}$, $R^{14}$, $R^{15}$, $R^{16}$ and $R^{17}$ represent a substituent or a single bond, respectively.

The transition metal complex preferably contains a moiety represented by any one of the following formulae (2), (8), (9), (10) and (18). Further, the transition metal complex containing the moiety of the formula (2) is preferably represented by the following formula (3).

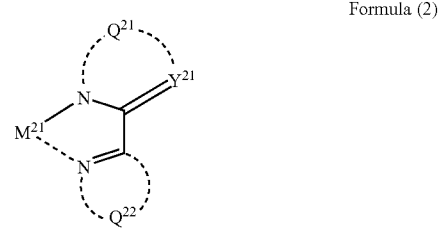

Formula (2)

In the formula (2), $M^{21}$ represents a transition metal ion; $Y^{21}$ represents a nitrogen atom or a substituted or unsubstituted carbon atom; and $Q^{21}$ and $Q^{22}$ represent an atomic group forming a nitrogen-containing heterocyclic ring, respectively.

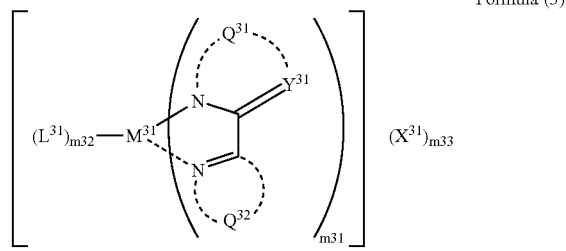

Formula (3)

In the formula (3), $M^{31}$ represents a transition metal ion; $Y^{31}$ represents a nitrogen atom or a substituted or unsubstituted carbon atom; $Q^{31}$ and $Q^{32}$ represent an atomic group forming a nitrogen-containing heterocyclic ring, respectively; $L^{31}$ represents a ligand; $X^{31}$ represents a counter ion; m31 represents an integer of 1 to 4; m32 represents an integer of 0 to 3; and m33 represents an integer of 0 to 4.

Formula (8)

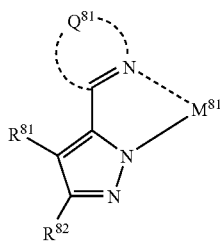

In the formula (8), $M^{81}$ represents a transition metal ion; $Q^{81}$ represents an atomic group forming a nitrogen-containing heterocyclic ring; and $R^{81}$ and $R^{82}$ represent a hydrogen atom or a substituent, respectively.

Formula (9)

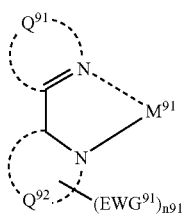

In the formula (9), $M^{91}$ represents a transition metal ion; $Q^{91}$ and $Q^{92}$ represent an atomic group forming a nitrogen-containing heterocyclic ring, respectively; $EWG^{91}$ represents an electron-withdrawing group; and n91 represents an integer of 1 or more.

Formula (10)

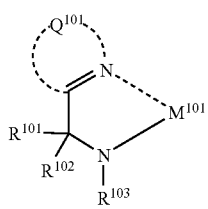

In the formula (10), $M^{101}$ represents a transition metal ion; $Q^{101}$ represents an atomic group forming a nitrogen-containing heterocyclic ring; and $R^{101}$, $R^{102}$ and $R^{103}$ represent a hydrogen atom or a substituent, respectively.

Formula (18)

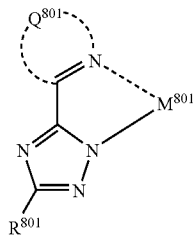

In the formula (18), M801 represents a transition metal ion; $Q^{801}$ represents an atomic group forming a nitrogen-containing heterocyclic ring; and $R^{801}$ represents a hydrogen atom or a substituent.

Also, the transition metal complex preferably contains a moiety represented by the following formula (11), more preferably contains a moiety represented by the following formula (12).

Formula (11)

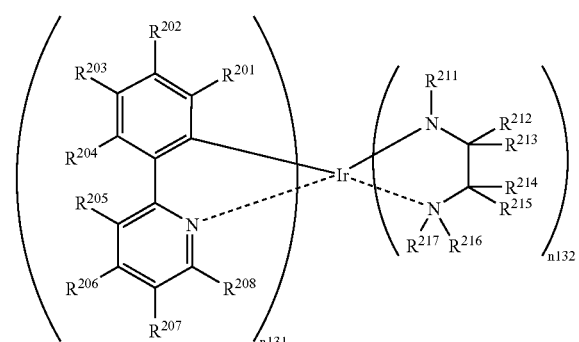

In the formula (11), $M^{111}$ represents a transition metal ion; $Q^{111}$ represents an atomic group forming a ring; $Q^{112}$ represents an atomic group forming a nitrogen-containing heterocyclic ring; $EWG^{111}$ represents an electron-withdrawing group; n111 represents an integer of 1 or more; and $R^{111}$, $R^{112}$, $R^{113}$, $R^{114}$, $R^{115}$, $R^{116}$ and $R^{117}$ represent a substituent.

Formula (12)

In the formula (12), $R^{201}$, $R^{202}$, $R^{203}$, $R^{204}$, $R^{205}$, $R^{206}$, $R^{207}$ and $R^{208}$ represent a hydrogen atom or a substituent, respectively, at least one of $R^{201}$, $R^{202}$, $R^{203}$ and $R^{204}$ being a fluorine atom; $R^{211}$, $R^{212}$, $R^{213}$, $R^{214}$, $R^{215}$, $R^{216}$ and $R^{217}$ represent a substituent single bond, or a single bond, respectively; and n131 and n132 are 1 or 2, respectively.

In the light-emitting device of the present invention, it is preferable that the light-emitting layer comprises the transition metal complex or the tautomer thereof and a host compound. $T_1$ level of the host compound is preferably 260 to 356 kJ/mol. Further, it is preferred that a compound contained in a layer adjacent to the light-emitting layer has a $T_1$ level of 260 to 356 kJ/mol.

Novel transition metal complexes represented by any of the following formulae (6), (13), (14), (19) and (20) may be preferably used for the light-emitting device of the present invention.

Formula (6)

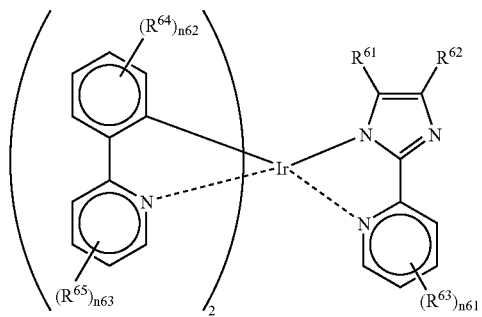

In the formula (6), $R^{61}$ and $R^{62}$ represent a hydrogen atom or a substituent, respectively; $R^{63}$, $R^{64}$ and $R^{65}$ represent a substituent, respectively; and n61, n62 and n63 represent an integer of 0 to 4, respectively.

Formula (13)

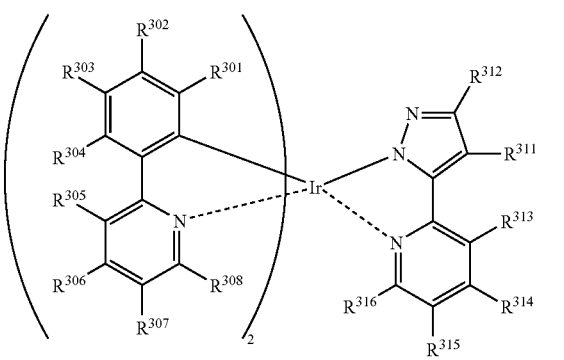

In the formula (13), $R^{301}$, $R^{302}$, $R^{303}$, $R^{304}$, $R^{305}$, $R^{306}$, $R^{307}$, $R^{308}$, $R^{311}$, $R^{312}$, $R^{313}$, $R^{314}$, $R^{315}$ and $R^{316}$ represent a hydrogen atom or a substituent, respectively.

Formula (14)

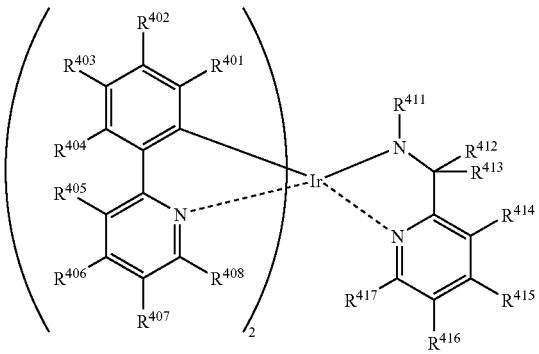

In the formula (14), $R^{401}$, $R^{402}$, $R^{403}$, $R^{404}$, $R^{405}$, $R^{406}$, $R^{407}$, $R^{408}$, $R^{411}$, $R^{412}$, $R^{413}$, $R^{414}$, $R^{415}$, $R^{416}$ and $R^{417}$ represent a hydrogen atom or a substituent, respectively.

Formula (19)

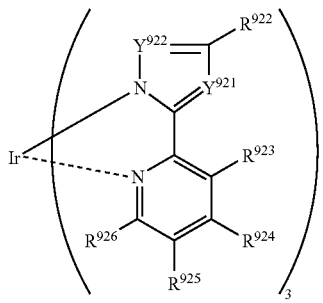

In the formula (19), $R^{901}$, $R^{902}$, $R^{903}$, $R^{904}$, $R^{905}$, $R^{906}$, $R^{907}$, $R^{908}$, $R^{912}$, $R^{913}$, $R^{914}$, $R^{915}$ and $R^{916}$ represent a hydrogen atom or a substituent, respectively.

Incidentally, $R^{901}$, $R^{902}$, $R^{903}$, $R^{904}$, $R^{905}$, $R^{906}$, $R^{907}$, $R^{908}$, $R^{912}$, $R^{913}$, $R^{914}$, $R^{915}$ $R^{916}$ are free of a transition metal ion or a transition metal atom.

Formula (20)

In the formula (20), $Y^{921}$ and $Y^{922}$ represent a nitrogen atom or a substituted or unsubstituted carbon atom, respectively; and $R^{922}$, $R^{923}$, $R^{924}$, $R^{925}$ and $R^{926}$ represent a hydrogen atom or a substituent, respectively.

DETAILED DESCRIPTION OF THE PREFERRED EMBODIMENTS

[1] Transition Metal Complex

A light-emitting device of the present invention comprises a transition metal complex containing a moiety represented by the following formula (1) or a tautomer thereof. In the present invention, the transition metal complex containing the moiety represented by the formula (1) and the tautomer thereof is hereinafter referred to as "transition metal complex (1)".

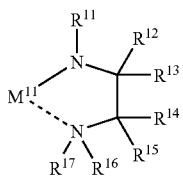

Formula (1)

In the formula (1), $M^{11}$ represents a transition metal ion. The transition metal ion is not particularly limited, preferably a ruthenium ion, a rhodium ion, a palladium ion, a tungsten ion, a rhenium ion, an osmium ion, an iridium ion or a platinum ion, more preferably a ruthenium ion, a rhenium ion, an iridium ion or a platinum ion, particularly preferably an iridium ion, most preferably a trivalent iridium ion.

$R^{11}$, $R^{12}$, $R^{13}$, $R^{14}$, $R^{15}$, $R^{16}$ and $R^{17}$ represent a substituent or a single bond, respectively. $R^{12}$ and $R^{13}$ may form a carbon-carbon double bond, a carbon-oxygen double bond or a carbon-nitrogen double bond in combination with each other. Also, $R^{14}$ and $R^{15}$ may form a carbon-carbon double bond, a carbon-oxygen double bond or a carbon-nitrogen double bond in combination with each other. Further, combination of $R^{15}$ and $R^{16}$ may form a carbon-nitrogen double bond, and combination of $R^{16}$ and $R^{17}$ may form a carbon-nitrogen double bond or a nitrogen-nitrogen double bond.

Examples of the substituent represented by $R^{11}$, $R^{12}$, $R^{13}$, $R^{14}$, $R^{15}$, $R^{16}$ or $R^{17}$ include: alkyl groups, the number of carbon atom thereof being preferably 1 to 30, more preferably 1 to 20, particularly preferably 1 to 10, such as a methyl group, an ethyl group, an isopropyl group, a t-butyl group, a n-octyl group, a n-decyl group, a n-hexadecyl group, a cyclopropyl group, a cyclopentyl group and a cyclohexyl group; alkenyl groups, the number of carbon atoms thereof being preferably 2 to 30, more preferably 2 to 20, particularly preferably 2 to 10, such as a vinyl group, an allyl group, a 2-butenyl group and a 3-pentenyl group; alkynyl groups, the number of carbon atoms thereof being preferably 2 to 30, more preferably 2 to 20, particularly preferably 2 to 10, such as a propargyl group and a 3-pentynyl group; aryl groups, the number of carbon atoms thereof being preferably 6 to 30, more preferably 6 to 20, particularly preferably 6 to 12, such as a phenyl group, a p-methylphenyl group, a naphtyl group, an anthryl group, a phenanthryl group and a pyrenyl group; amino groups, the number of carbon atom thereof being preferably 0 to 30, more preferably 0 to 20, particularly preferably 0 to 10, such as a unsubstituted amino group, a methylamino group, a dimethylamino group, a diethylamino group, a dibenzylamino group, a diphenylamino group and a ditolylamino group; alkoxy groups, the number of carbon atom thereof being preferably 1 to 30, more preferably 1 to 20, particularly preferably 1 to 10, such as a methoxy group, an ethoxy group, a butoxy group and a 2-ethylhexyloxy group; aryloxy groups, the number of carbon atoms thereof being preferably 6 to 30, more preferably 6 to 20, particularly preferably 6 to 12, such as a phenyloxy group, a 1-naphthyloxy group and a 2-naphthyloxy group; heterocyclic oxy groups, the number of carbon atom thereof being preferably 1 to 30, more preferably 1 to 20, particularly preferably 1 to 12, such as a pyridyloxy group, a pyrazyloxy group, a pyrimidyloxy group and a quinolyloxy group; silyloxy groups, the number of carbon atom thereof being preferably 3 to 40, more preferably 3 to 30, particularly preferably 3 to 24, such as a trimethylsilyloxy group and a triphenylsilyloxy group; acyl groups, the number of carbon atom thereof being preferably 1 to 30, more preferably 1 to 20, particularly preferably 1 to 12, such as an acetyl group, a benzoyl group, a formyl group and a pivaloyl group; alkoxycarbonyl groups, the number of carbon atoms thereof being preferably 2 to 30, more preferably 2 to 20, particularly preferably 2 to 12, such as a methoxycarbonyl group and an ethoxycarbonyl group; aryloxycarbonyl groups, the number of carbon atoms thereof being preferably 7 to 30, more preferably 7 to 20, particularly preferably 7 to 12, such as a phenyloxycarbonyl group; acyloxy groups, the number of carbon atoms thereof being preferably 2 to 30, more preferably 2 to 20, particularly preferably 2 to 10, such as an acetoxy group and-a benzoyloxy group; acylamino groups, the number of carbon atoms thereof being preferably 2 to 30, more preferably 2 to 20, particularly preferably 2 to 10, such as an acetylamino group and a benzoylamino group; alkoxycarbonylamino groups, the number of carbon atoms thereof being preferably 2 to 30, more preferably 2 to 20, particularly preferably 2 to 12, such as a methoxycarbonylamino group; aryloxycarbonylamino groups, the number of carbon atoms thereof being preferably 7 to 30, more preferably 7 to 20, particularly preferably 7 to 12, such as a phenyloxycarbonylamino group; sulfonylamino groups, the number of carbon atom thereof being preferably 1 to 30, more preferably 1 to 20, particularly preferably 1 to 12, such as a methane sulfonylamino group and a benzene sulfonylamino group; sulfamoyl groups, the number of carbon atom thereof being preferably 0 to 30, more preferably 0 to 20, particularly preferably 0 to 12, such as a unsubstituted sulfamoyl group, a methylsulfamoyl group, a dimethylsulfamoyl group and a phenylsulfamoyl group; carbamoyl groups, the number of carbon atom thereof being preferably 1 to 30, more preferably 1 to 20, particularly preferably 1 to 12, such as a unsubstituted carbamoyl group, a methylcarbarmoyl group, a diethylcarbamoyl group and a phenylcarbamoyl group; alkylthio groups, the number of carbon atom thereof being preferably 1 to 30, more preferably 1 to 20, particularly preferably 1 to 12, such as a methylthio group and an ethylthio group; arylthio groups, the number of carbon atoms thereof being preferably 6 to 30, more preferably 6 to 20, particularly preferably 6 to 12, such as a phenylthio group; heterocyclic thio groups, the number of carbon atom thereof being preferably 1 to 30, more preferably 1 to 20, particularly preferably 1 to 12, such as a pyridylthio group, a 2-benzimidazolylthio group, a 2-benzoxazolylthio group and a 2-benzthiazolylthio group; sulfonyl groups, the number of carbon atom thereof being preferably 1 to 30, more preferably 1 to 20, particularly preferably 1 to 12, such as a mesyl group and a tosyl group; sulfinyl groups, the number of carbon atom thereof being preferably 1 to 30, more preferably 1 to 20, particularly preferably 1 to 12, such as a methane sulfinyl group and a benzene sulfinyl group; ureide groups, the number of carbon atom thereof being preferably 1 to 30, more preferably 1 to 20, particularly preferably 1 to 12, such as a unsubstituted ureide group, a methylureide group and a phenylureide group; phosphoric amide groups, the number of carbon atom thereof being preferably 1 to 30, more preferably 1 to 20, particularly preferably 1 to 12, such as a diethylphosphoric amide group and a phenylphosphoric amide group; a hydroxyl group; a mercapto group; halogen atoms such as a fluorine atom, a chlorine atom, a bromine atom and an iodine atom; a cyano group; a sulfo group; a carboxyl group; a nitro group; a hydroxamic acid group; a sulfino group; a hydrazino group; an imino group; heterocyclic groups that may be aliphatic or aromatic and may have a nitrogen atom, a oxygen atom, a sulfur atom, etc. as a hetero atom, the number of carbon atom thereof being preferably 1 to 30, more preferably 1 to 12, such as an imidazolyl group, a pyridyl group, a quinolyl group, a furyl group, a thienyl group, a piperidyl group, a morpholino group, a benzoxazolyl group, a benzoimidazolyl group, a benzothiazolyl group, a carbazolyl group and an azepinyl group; silyl groups, the number of carbon atom thereof being preferably 3 to 40, more preferably 3 to 30, particularly preferably 3 to 24, such as a trimethylsilyl group and a triphenylsilyl group; phosphino groups, the number of carbon atom thereof being preferably 2 to 30, more preferably 2 to 12, such as a dimethylphosphino group and a diphenylphosphino group; etc. The substituent may be further substituted. When two or more of $R^{11}$, $R^{12}$, $R^{13}$, $R^{14}$, $R^{15}$, $R^{16}$ and $R^{17}$ each represents the substituent, they may be the same or different and may bond together to form a ring. The substituent may bond to the metal atom to form a chelate complex.

$R^{11}$ is preferably an alkyl group, an alkenyl group, an aryl group, a carbonyl group, a sulfonyl group or a substituted amino group.

It is preferred that $R^{12}$ and $R^{13}$ are an alkyl group or an aryl group, respectively, or that $R^{12}$ and $R^{13}$ form a carbon-oxygen double bond, a carbon-nitrogen double bond or a carbon-carbon double bond in combination with each other.

It is preferred that $R^{14}$ and $R^{15}$ are an alkyl group or an aryl group, respectively, or that $R^{14}$ and $R^{15}$ form a carbon-oxygen double bond, a carbon-nitrogen double bond or a carbon-carbon double bond in combination with each other. It is also preferred that $R^{15}$ forms a carbon-nitrogen double bond in combination with $R^{16}$.

It is preferred that $R^{16}$ and $R^{17}$ are an alkyl group, an aryl group or a substituted amino group, respectively, or that $R^{16}$ and $R^{17}$ form a carbon-nitrogen double bond or a nitrogen-nitrogen double bond in combination with each other. It is also preferred that $R^{16}$ forms a carbon-nitrogen double bond in combination with $R^{15}$.

The transition metal complex (1) may comprise one transition metal atom or a plurality of transition metal atoms, thus, the transition metal complex (1) may be a so-called multi-nuclear complex. In the case of the multi-nuclear complex, a plurality of transition metal atoms may be the same or different atoms.

The transition metal complex (1) may comprise ligands of a plurality of kinds. The transition metal complex (1) preferably comprises 1 to 3 kind of ligand, more preferably comprises 1 or 2 kind of ligand.

The transition metal complex (1) may comprise a ligand other than that contained in the moiety of the formula (1). Such a ligand is not particularly limited and may be such that is disclosed in: H. Yersin, "Photochemistry and Photophysics of Coordination Compounds", Springer-Verlag, Inc. (1987); Akio Yamamoto, "Yukikinzoku-Kagaku, Kiso to Oyo (Metalorganic Chemistry, Foundation and Application)", Shokabo Publishing Co., Ltd., (1982); etc. Preferred as the ligand are: halogen ligands such as a chlorine ligand and a fluorine ligand; nitrogen-containing heterocyclic ring ligands such as bipyridyl ligands, phenanthroline ligands and phenylpyridine ligands; diketone ligands; nitrile ligands; CO ligand; isonitrile ligands; phosphorus ligands such as phosphine ligands, phosphite ligands and phosphinine ligands; and carboxylic acid ligands such as an acetic acid ligand.

The transition metal complex (1) may be a neutral complex or an ionic complex comprising a counter ion. The counter ion is not particularly limited. The counter ion is preferably an alkaline metal ion, an alkaline earth metal ion, a halogen ion, a perchlorate ion, a $PF_6$ ion, an ammonium ion such as a tetramethylammonium ion, a borate ion or a phosphonium ion, more preferably a perchlorate ion or a $PF_6$ ion. The transition metal complex (1) is preferably a neutral complex.

The transition metal complex (1) is preferably a transition metal complex containing a moiety represented by any one of the following formulae (2), (8), (9), (10) and (18) or a tautomer thereof, more preferably a transition metal complex containing a moiety represented by any one of the formulae (8), (10) and (18) or a tautomer thereof, particularly preferably a transition metal complex containing a moiety represented by the formula (8) or a tautomer thereof.

The transition metal complex containing the moiety represented by the formula (2) or the tautomer thereof is preferably a transition metal complex represented by the following formula (3) or a tautomer thereof, more preferably a transition metal complex represented by the following formula (4) or a tautomer thereof, particularly preferably a transition metal complex represented by the following formula (5) or a tautomer thereof. Preferred embodiments of the transition metal complex represented by the formula (5) include such that is represented by any of the following formulae (6) and (7). Further, it is also preferable that the transition metal complex containing the moiety represented by the formula (2) is represented by the following formula (20).

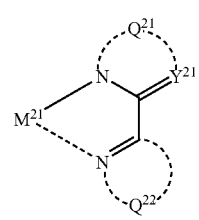

Formula (2)

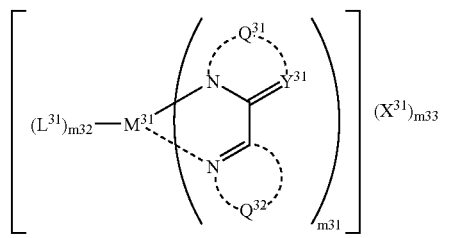

Formula (3)

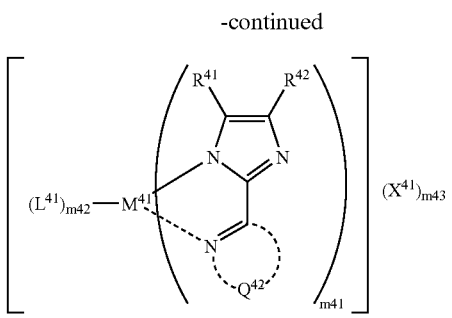

Formula (4)

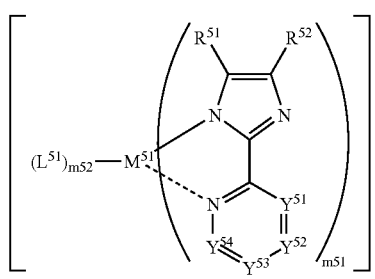

Formula (5)

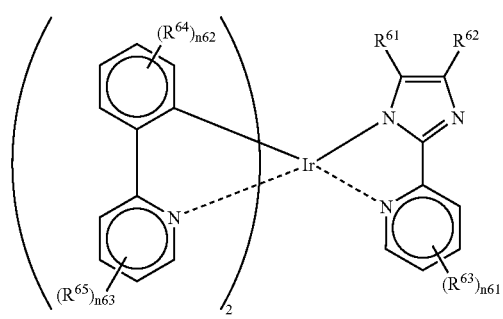

Formula (6)

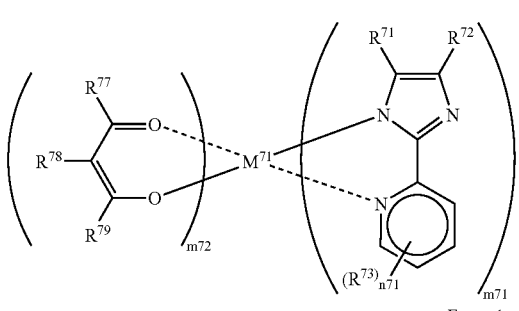

Formula (7)

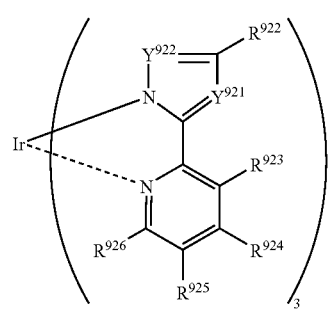

Formula (20).

The formula (2) will be described below. In the formula (2), $M^{21}$ is the same as above-mentioned $M^{11}$ with respect to meaning and preferred embodiments. Y21 represents a nitrogen atom or a substituted or unsubstituted carbon atom. The carbon atom may has a substituent with examples being the same as those for the substituent represented by $R^{11}$ to $R^{17}$. $Q^{21}$ and $Q^{22}$ represent an atomic group forming a nitrogen-containing heterocyclic ring, respectively.

The nitrogen-containing heterocyclic ring formed by $Q^{21}$ is not particularly limited and preferably an imidazole ring, a pyrrole ring, a triazole ring, a pyrazole ring, an imidazoline ring, a pyridone ring or a condensed ring thereof such as a benzimidazole ring and an indole ring.

The nitrogen-containing heterocyclic ring formed by $Q^{22}$ is not particularly limited and preferably a pyridine ring, a pyrazine ring, a pyrimidine ring, a triazine ring, a thiazole ring, an oxazole ring, an imidazole ring, a pyrazole ring, a triazole ring, an indolenine ring or a condensed ring thereof such as a quinoline ring, a benzoxazole ring and a benzimidazole ring.

The formula (3) will be described below. In the formula (3), $M^{31}$, $Y^{31}$, $Q^{31}$ and $Q^{32}$ are the same as above-mentioned $M^{21}$, $Y^{21}$, $Q^{21}$ and $Q^{22}$ with respect to meaning and preferred embodiments, respectively. $L^{31}$ represents a ligand, and $X^{31}$ represents a counter ion.

The ligand represented by $L^{31}$ may be the same as the above-mentioned ligand other than that contained in the moiety of the formula (1). The ligand represented by $L^{31}$ is preferably selected from the group consisting of: halogen ligands such as a chlorine ligand and a fluorine ligand; nitrogen-containing heterocyclic ring ligands such as phenylpyridine ligands, benzoquinoline ligands, quinolinol ligands, bipyridyl ligands and phenanthroline ligands; diketone ligands such as acetylacetone; carboxylic acid ligands such as an acetic acid ligand, a benzoic acid ligand and a picolinic acid ligand; a carbon monoxide ligand; isonitrile ligands; cyano ligands; and phosphorus ligands such as phosphine ligands, phosphite ligands and phosphinine ligands.

The counter ion represented by $X^{31}$ is not particularly limited, and preferably an alkaline metal ion, an alkaline earth metal ion, a halogen ion, a perchlorate ion, a $PF_6$ ion, an ammonium ion such as a tetramethylammonium ion, a borate ion or a phosphonium ion, more preferably a perchlorate ion or a $PF_6$ ion.

m31 is an integer of 1 to 4, preferably 1, 2 or 3. m32 is an integer of 0 to 3, preferably 0, 1 or 2. m33 is an integer of 0 to 4, preferably 0, 1 or 2, more preferably 0. When m32 is 2 or more, a plurality of $L^{31}$'s may be the same or different ligands. When m33 is 2 or more, a plurality of $X^{31}$'s may be the same or different counter ions. m31 and m32 are particularly preferably selected such that the transition metal complex (1) is a neutral complex.

The formula (4) will be described below. In the formula (4), $M^{41}$, $Q^{42}$, $X^{41}$, $L^{41}$, m41, m42 and m43 are the same as above-mentioned $M^{31}$, $Q^{32}$, $X^{31}$, $L^{31}$, m31, m32 and m33 with respect to meaning and preferred embodiments, respectively. $R^{41}$ and $R^{42}$ represent a hydrogen atom or a substituent with examples being the same as those for the substituent represented by $R^{11}$ to $R^{17}$, respectively. $R^{41}$ and $R^{42}$ may bond together to form a condensed ring structure such as a benzimidazole ring. It is preferable that $R^{41}$ and $R^{42}$ are a hydrogen atom, an alkyl group or an aryl group, respectively, or that $R^{41}$ and $R^{42}$ bond together to form an aromatic ring. It is more preferable that $R^{41}$ and $R^{42}$ are an alkyl group or an aryl group, respectively, or that $R^{41}$ and $R^{42}$ bond together to form an aromatic ring.

The formula (5) will be described below. In the formula (5), $M^{51}$, $L^{51}$, $R^{51}$, $R^{52}$, m51 and m52 are the same as above-mentioned $M^{41}$, $L^{41}$, $R^{41}$, $R^{42}$, m41 and m42 with respect to meaning and preferred embodiments, respectively. $Y^{51}$, $Y^{52}$, $Y^{53}$ and $Y^{54}$ represent a substituted or unsubstituted carbon atom or a nitrogen atom, respectively. The carbon atom may have a substituent with examples being the same as those for the substituent represented by $R^{11}$ to $R^{17}$.

The formula (6) will be described below. In the formula (6), $R^{61}$ and $R^{62}$ are the same as above-mentioned $R^{51}$ and $R^{52}$ with respect to meaning and preferred embodiments, respectively. $R^{63}$, $R^{64}$ and $R^{65}$ represent a substituent with examples being the same as those for the substituent represented by $R^{11}$ to $R^{17}$, respectively. $R^{63}$, $R^{64}$ and $R^{65}$ are preferably an alkyl group, an aryl group, an alkoxy group, a substituted amino group or a halogen atom, more preferably an alkyl group, an aryl group or a fluorine atom, respectively. n61, n62 and n63 are an integer of 0 to 4, preferably 0, 1 or 2, respectively.

The formula (7) will be described below. In the formula (7), $M^{71}$, $R^{71}$, $R^{72}$, $R^{73}$, m71, m72 and n71 are the same as above-mentioned $M^{51}$, $R^{51}$, $R^{52}$, $R^{63}$, m51, m52 and n61 with respect to meaning and preferred embodiments, respectively. $R^{77}$, $R^{78}$ and $R^{79}$ represent a hydrogen atom or a substituent with examples being the same as those for the substituent represented by $R^{11}$ to $R^{17}$, respectively. $R^{77}$ and $R^{79}$ are preferably an alkyl group, an aryl group, an alkoxy group or an amino group, more preferably an alkyl group, respectively. $R^{78}$ is preferably a hydrogen atom, an alkyl group or an aryl group, more preferably a hydrogen atom or an alkyl group.

The formula (20) will be described below. In the formula (20), $R^{922}$, $R^{923}$, $R^{924}$, $R^{925}$ and $R^{926}$ represent a hydrogen atom or a substituent with examples being the same as those for the substituent represented by $R^{11}$ to $R^{17}$, respectively. $R^{922}$ is preferably a hydrogen atom, an alkyl group, an aryl group or an electron-withdrawing group. Hammett sigma constant (σp or σm, reference: Chem. Rev. 1991, 91, 165) of this electron-withdrawing group is preferably 0.1 or more, more preferably 0.3 or more. Preferred as the electron-withdrawing group are a fluorine atom, a trifluoromethyl group, an acetyl group, a methane sulfonyl group, a trifluoroacetyl group, a trifluoromethane sulfonyl group and a cyano group. Among them, more preferred are a fluorine atom, a trifluoromethyl group, a trifluoroacetyl group and a trifluoromethane sulfonyl group, and further preferred are a fluorine atom and a trifluoromethyl group, particularly preferred is a trifluoromethyl group.

$Y^{921}$ and $Y^{922}$ represent a nitrogen atom or a substituted or unsubstituted carbon atom, respectively. The carbon atom may have a substituent with examples being the same as those for the substituent represented by $R^{11}$ to $R^{17}$. The substituent on the carbon atom has preferred embodiments as above-mentioned $R^{922}$. $Y^{921}$ is preferably a substituted or unsubstituted carbon atom, and $Y^{922}$ is preferably a nitrogen atom.

The transition metal complex containing the moiety represented by the following formula (8) or the tautomer thereof is preferably a transition metal complex represented by the following formula (15) or a tautomer thereof, more preferably a transition metal complex represented by the following formula (13) or a tautomer thereof.

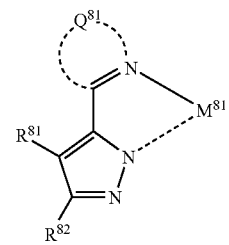

Formula (8)

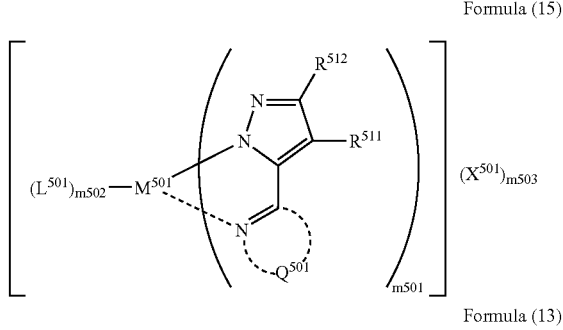

Formula (15)

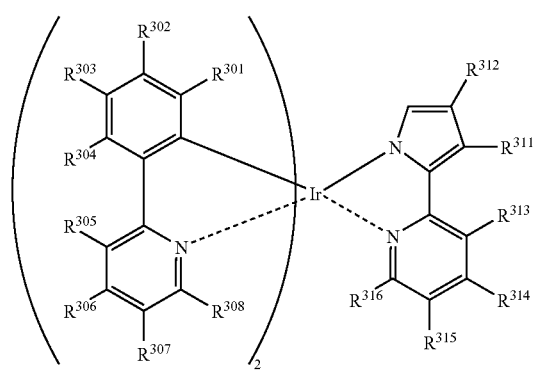

Formula (13)

The formula (8) will be described below. In the formula (8), $M^{81}$ and $Q^{81}$ are the same as above-mentioned $M^{11}$ and $Q^{32}$ with respect to meaning and preferred embodiments, respectively. $R^{81}$ and $R^{82}$ represent a hydrogen atom or a substituent with examples being the same as those for the substituent represented by $R^{11}$ to $R^{17}$, respectively. $R^{81}$ and $R^{82}$ are preferably a hydrogen atom, an alkyl group, an aryl group or an electron-withdrawing group, respectively. It is particularly preferable that at least one of $R^{81}$ and $R^{82}$ is an electron-withdrawing group. This electron-withdrawing group has the same preferred embodiments as described for that represented by $R^{922}$ in the formula (20).

The formula (15) will be described below. In the formula (15), $M^{501}$, $Q^{501}$, $X^{501}$, $L^{501}$, m501, m502, m503, $R^{511}$ and $R^{512}$ are the same as above-mentioned $M^{81}$, $Q^{81}$, $X^{31}$, $L^{31}$, m31, m32, m33, $R^{81}$ and $R^{82}$ with respect to meaning and preferred embodiments, respectively.

The formula (13) will be described below. In the formula (13), $R^{301}$, $R^{302}$, $R^{303}$ and $R^{304}$ represent a hydrogen atom or a substituent, respectively. $R^{301}$ and $R^{303}$ are preferably a hydrogen atom, an alkyl group or a fluorine atom, more preferably a hydrogen atom, respectively. $R^{302}$ is preferably a hydrogen atom, an alkyl group or a fluorine atom, more preferably a fluorine atom. $R^{304}$ is preferably a hydrogen atom, an alkyl group or a fluorine atom, more preferably a hydrogen atom or a fluorine atom, particularly preferably a fluorine atom. $R^{305}$, $R^{306}$, $R^{307}$ and $R^{308}$ represent a hydrogen atom or a substituent, respectively. $R^{305}$ and $R^{307}$ are preferably a hydrogen atom, an alkyl group or an alkoxy group, more preferably a hydrogen atom or an alkyl group, respectively. $R^{306}$ and $R^{308}$ are preferably a hydrogen atom, an alkyl group, an alkoxy group or a dialkylamino group, more preferably a hydrogen atom, an alkyl group or an alkoxy group, particularly preferably an alkoxy group, respectively. $R^{311}$ and $R^{312}$ are the same as above-mentioned $R^{81}$ and $R^{82}$ with respect to meaning and preferred embodiments, respectively. $R^{313}$, $R^{314}$, $R^{315}$ and $R^{316}$ are the same as above-mentioned $R^{305}$, $R^{306}$, $R^{307}$ and $R^{308}$ with respect to meaning and preferred embodiments, respectively.

The transition metal complex containing the moiety represented by the following formula (9) or the tautomer thereof is preferably a transition metal complex represented by the following formula (16) or a tautomer thereof.

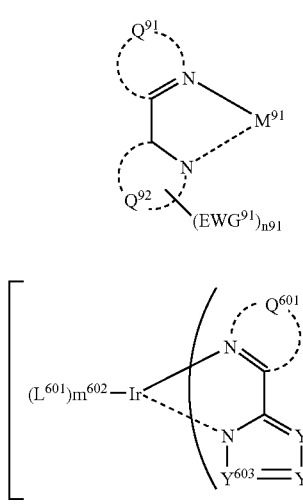

Formula (9)

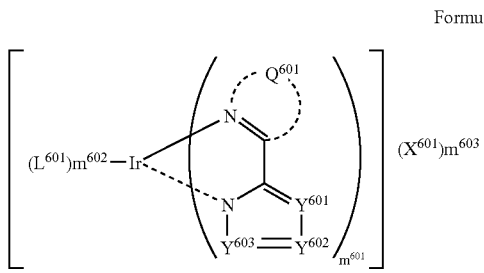

Formula (16)

The formula (9) will be described below. In the formula (9), $M^{91}$ and $Q^{91}$ are the same as above-mentioned $M^{11}$ and $Q^{32}$ with respect to meaning and preferred embodiments, respectively. $Q^{92}$ represents an atomic group forming a nitrogen-containing heterocyclic ring. The nitrogen-containing heterocyclic ring formed by $Q^{92}$ is preferably a pyrrole ring, an imidazole ring, a pyrazole ring, a triazole ring, a benzimidazole ring or an indole ring, more preferably a pyrrole ring, a pyrazole ring or an imidazole ring, particularly preferably a pyrazole ring. $EWG^{91}$ represents an electron-withdrawing group having the same preferred embodiments as described for that represented by $R^{922}$ in the formula (20). n91 is an integer of 1 or more, preferably an integer of 1 to 3, more preferably 1 or 2.

The formula (16) will be described below. In the formula (16), $Y^{601}$, $Y^{602}$ and $Y^{603}$ represent a nitrogen atom or a substituted or unsubstituted carbon atom, respectively, at least one of $Y^{601}$, $Y^{602}$ and $Y^{603}$ being a carbon atom substituted by an electron-withdrawing group. This electron-withdrawing group has the same preferred embodiments as described for that represented by $R^{922}$ in the formula (20). $Q^{601}$, $X^{601}$, $L^{601}$, m601, m602 and m603 are the same as above-mentioned $Q^{91}$, $X^{31}$, $L^{31}$, m31, m32 and m33 with respect to meaning and preferred embodiments, respectively.

The transition metal complex containing the moiety represented by the following formula (10) or the tautomer thereof is preferably a transition metal complex represented by the following formula (17) or a tautomer thereof, more preferably a transition metal complex represented by the following formula (14) or a tautomer thereof.

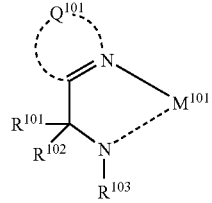

Formula (10)

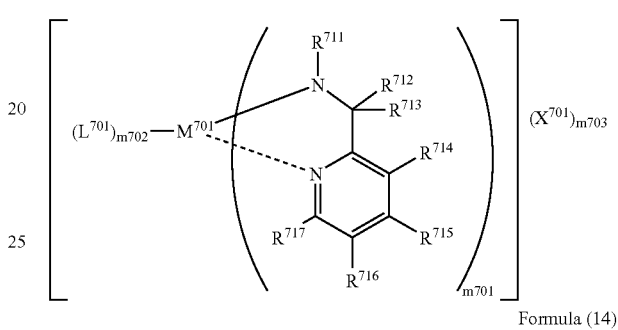

Formula (17)

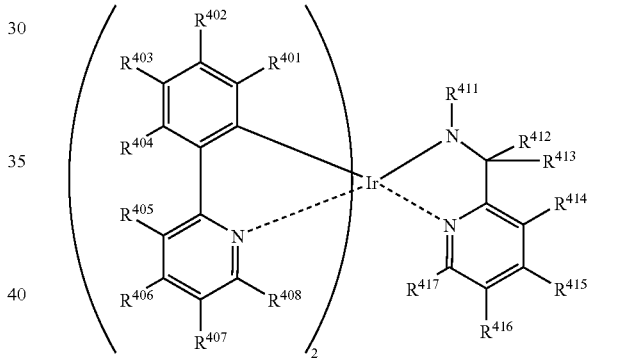

Formula (14)

The formula (10) will be described below. In the formula (10), $M^{101}$ and $Q^{101}$ are the same as above-mentioned $M^{11}$ and $Q^{32}$ with respect to meaning and preferred embodiments, respectively. $R^{101}$, $R^{102}$ and $R^{103}$ represent a hydrogen atom or a substituent, respectively. $R^{101}$ and $R^{102}$ are preferably a hydrogen atom or an alkyl group, respectively. $R^{103}$ is preferably an electron-withdrawing group, more preferably a substituted carbonyl group (an acetyl group, a dialkylaminocarbonyl group, a methoxycarbonyl group, a perfluorophenylcarbonyl group, etc.), a substituted sulfonyl group (a methane sulfonyl group, a benzene sulfonyl group, etc.), a substituted sulfoxide group (a methylsulfoxide group, etc.) or a trifluoromethyl group, further preferably an acyl group (an acetyl group, a trifluoromethyl group, a perfluorobenzoyl group, etc.) or a substituted sulfonyl group, particularly preferably a fluorine-substituted acyl group, a fluorine-substituted alkylsulfonyl group or a fluorine-substituted arylsulfonyl group.

The formula (17) will be described below. In the formula (17), $M^{701}$, $X^{701}$, $L^{701}$, m701, m702 and m703 are the same as above-mentioned $M^{101}$, $X^{31}$, $L^{31}$, m31, m32 and m33 with respect to meaning and preferred embodiments, respectively. $R^{711}$ is the same as above-mentioned $R^{103}$ with respect to meaning and preferred embodiments. $R^{712}$ and $R^{713}$ are the same as above-mentioned $R^{101}$ and $R^{102}$ with respect to meaning and preferred embodiments, respectively. $R^{714}$, $R^{715}$, $R^{716}$ and $R^{717}$ are the same as above-mentioned $R^{313}$, $R^{314}$, $R^{315}$ and $R^{316}$ with respect to meaning and preferred embodiments, respectively.

The formula (14) will be described below. In the formula (14), $R^{401}$, $R^{402}$, $R^{403}$, $R^{404}$, $R^{405}$, $R^{406}$, $R^{407}$ and $R^{408}$ are the same as above-mentioned $R^{301}$, $R^{302}$, $R^{303}$, $R^{304}$, $R^{305}$, $R^{306}$, $R^{307}$ and $R^{308}$ with respect to meaning and preferred embodiments, respectively. $R^{411}$, $R^{412}$, $R^{413}$ $R^{414}$, $R^{415}$, $R^{416}$ and $R^{417}$ are the same as above-mentioned $R^{711}$, $R^{712}$, $R^{713}$, $R^{714}$, $R^{715}$, $R^{716}$ and $R^{717}$ with respect to meaning and preferred embodiments, respectively.

The transition metal complex containing the moiety represented by the following formula (18) or the tautomer thereof is preferably a transition metal complex represented by the following formula (19) or a tautomer thereof.

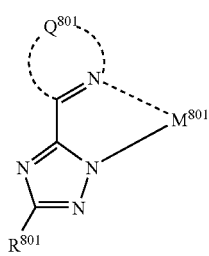

Formula (18)

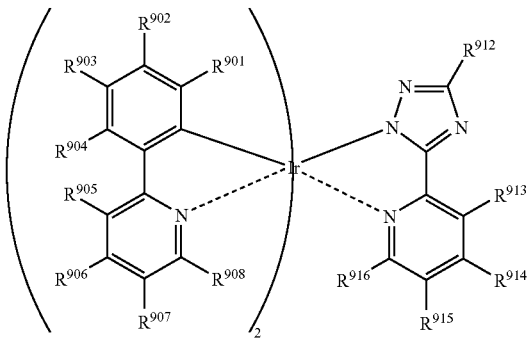

Formula (19)

The formula (18) will be described below. In the formula (18), $M^{801}$, $Q^{801}$ and $R^{801}$ are the same as above-mentioned $M^{11}$, $Q^{32}$ and $R^{82}$ with respect to meaning and preferred embodiments, respectively.

The formula (19) will be described below. In the formula (19), $R^{901}$, $R^{902}$, $R^{903}$, $R^{904}$, $R^{905}$, $R^{906}$, $R^{907}$, $R^{908}$, $R^{912}$, $R^{913}$, $R^{914}$, $R^{915}$ and $R^{916}$ are the same as above-mentioned $R^{301}$, $R^{302}$, $R^{303}$, $R^{304}$, $R^{305}$, $R^{306}$, $R^{307}$, $R^{308}$, $R^{312}$, $R^{313}$, $R^{314}$, $R^{315}$ and $R^{316}$ with respect to meaning and preferred embodiments, respectively. Incidentally, $R^{901}$, $R^{902}$, $R^{903}$, $R^{904}$, $R^{905}$, $R^{906}$, $R^{907}$, $R^{908}$, $R^{912}$, $R^{913}$, $R^{914}$, $R^{915}$ and $R^{916}$ preferably contain no transition metal ion and no transition metal atom.

Further, the transition metal complex (1) is preferably a transition metal complex containing a moiety represented by the following formula (11) or a tautomer thereof, more preferably a transition metal complex containing a moiety represented by the following formula (12) or a tautomer thereof.

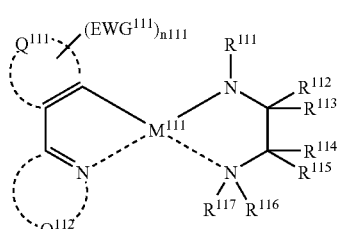

Formula (11)

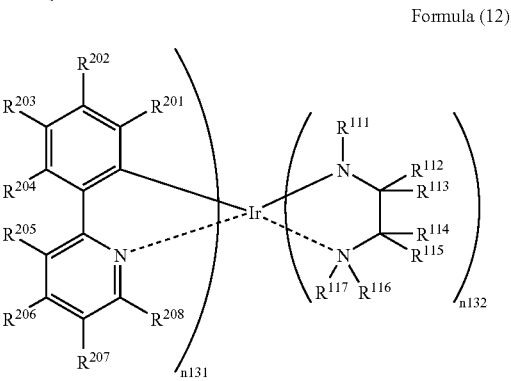

Formula (12)

The formula (11) will be described below. In the formula (11), $M^{111}$ and $Q^{112}$ are the same as above-mentioned $M^{11}$ and $Q^{32}$ with respect to meaning and preferred embodiments, respectively. $Q^{111}$ represents an atomic group forming a ring. The ring formed by $Q^{111}$ may be: an aromatic hydrocarbon ring such as a benzene ring and a naphthalene ring; an aromatic heterocycle such as a pyridine ring, a pyrazine ring, a quinoline ring, a furan ring and a thiophene ring; an aliphatic hydrocarbon ring such as a cyclohexene ring; aliphatic heterocycle such as a pyrane ring; etc. Of these, preferred are a benzene ring, a pyridine ring, a pyrazine ring and a pyrimidine ring, more preferred is a benzene ring. $EWG^{111}$ represents an electron-withdrawing group with the same examples as described for that represented by $R^{81}$ and $R^{82}$ in the formula (8). $EWG^{111}$ is preferably a fluorine atom. n111 is an integer of 1 or more, preferably an integer of 1 to 4, more preferably 1 or 2. $R^{111}$, $R^{112}$, $R^{113}$, $R^{114}$, $R^{115}$, $R^{116}$ and $R^{117}$ are the same as above-mentioned $R^{11}$, $R^{12}$, $R^{13}$, $R^{14}$, $R^{15}$, $R^{16}$ and $R^{17}$ with respect to meaning and preferred embodiments, respectively.

The formula (12) will be described below. In the formula (12), $R^{201}$, $R^{202}$, $R^{203}$, $R^{204}$, $R^{205}$, $R^{206}$, $R^{207}$ and $R^{208}$ are the same as above-mentioned $R^{301}$, $R^{302}$, $R^{303}$, $R^{304}$, $R^{305}$, $R^{306}$, $R^{307}$ and $R^{308}$ with respect to meaning and preferred embodiments, respectively. Incidentally, at least one of $R^{201}$, $R^{202}$, $R^{203}$ and $R^{204}$ is a fluorine atom. $R^{211}$, $R^{212}$, $R^{213}$, $R^{214}$, $R^{215}$, $R^{216}$ and $R^{217}$ are the same as above-mentioned $R^{11}$, $R^{12}$, $R^{13}$, $R^{14}$, $R^{15}$, $R^{16}$ and $R^{17}$ with respect to meaning and preferred embodiments, respectively. n131 and n132 are 1 or 2, respectively. n131 is preferably 2 and n132 is preferably 1.

The transition metal complex (1) is preferably a low molecular weight compound though it may be an oligomer or a polymer having a main chain or a side chain of repeating units containing the moiety represented by the formula (1). In the case where the transition metal complex (1) is an oligomer or a polymer, its weight-average molecular weight determined by polystyrene standard is preferably 1,000 to 5,000,000, more preferably 2,000 to 1,000,000, particularly preferably 3,000 to 100,000.

The transition metal complex (1) may be such that acts as a hole-injecting material, a hole-transporting material, a light-emitting material, an electron-transporting material, an electron-injecting material, etc. The transition metal complex (1) may have a plurality of functions. In this invention, the transition metal complex (1) is preferably used as a light-emitting material or an electron-transporting material, more preferably used as a light-emitting material. In the case of using the transition metal complex (1) as the light-emitting material, the maximum emission wavelength $\lambda_{max}$ of the transition metal complex (1) is preferably 380 nm to 500 nm, more preferably 400 nm to 480 nm. Concrete examples of the transition metal complex (1) will be illustrated below without intention of restricting the scope of the present invention defined by the claims attached hereto.

(1-1)
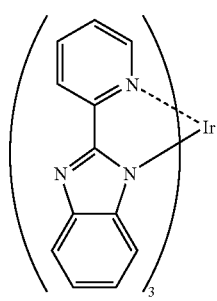

(1-2)
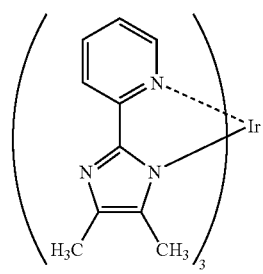

(1-3)
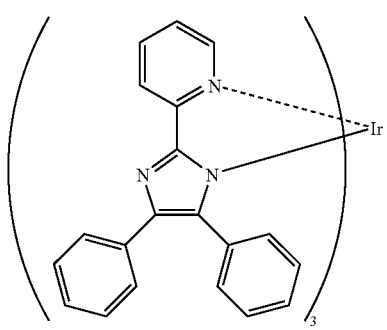

-continued (1-4)
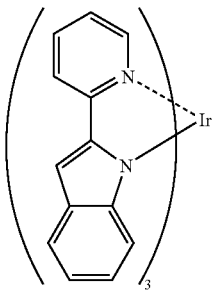

(1-5)
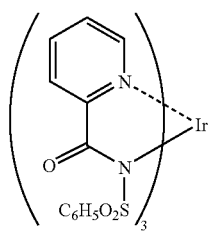

(1-6)
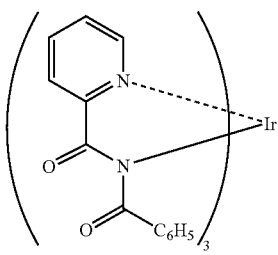

(1-7)
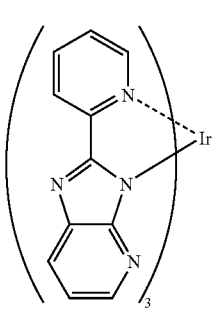

(1-8)
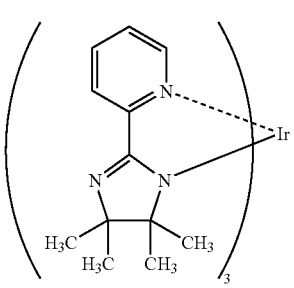

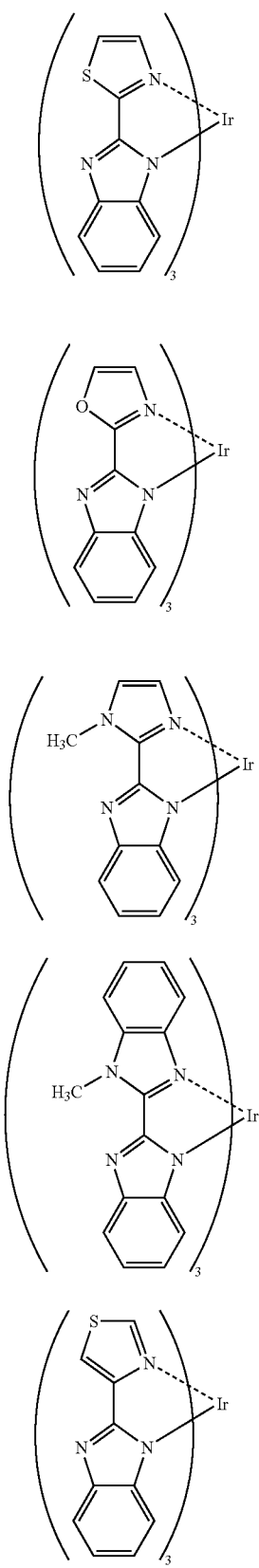
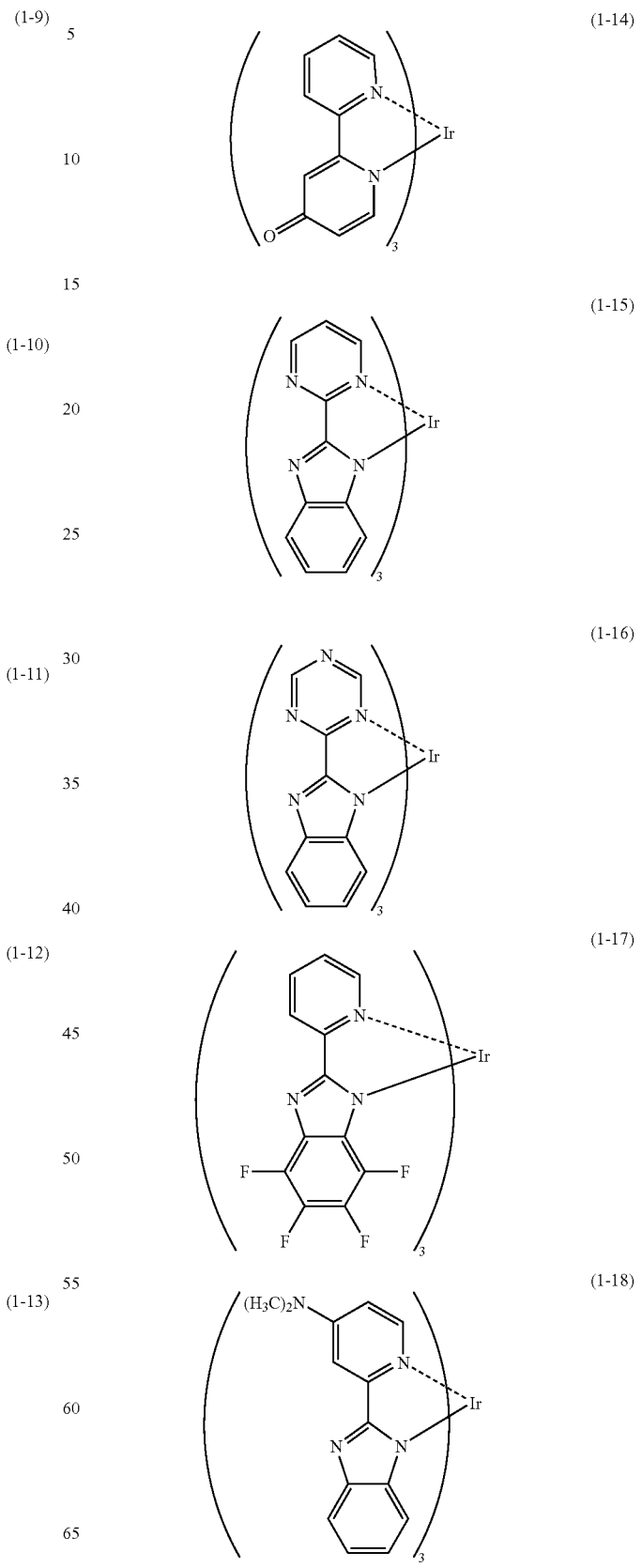

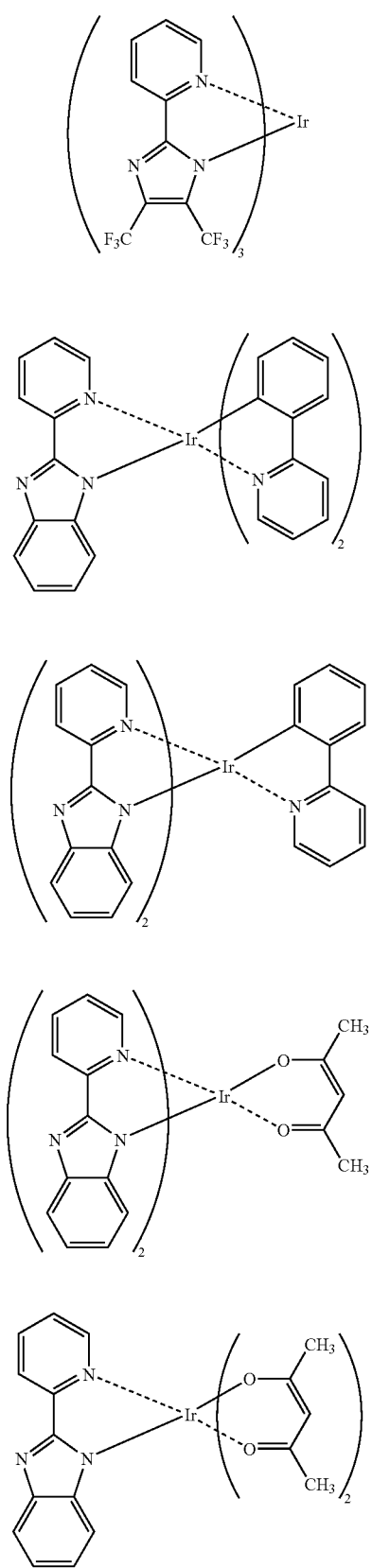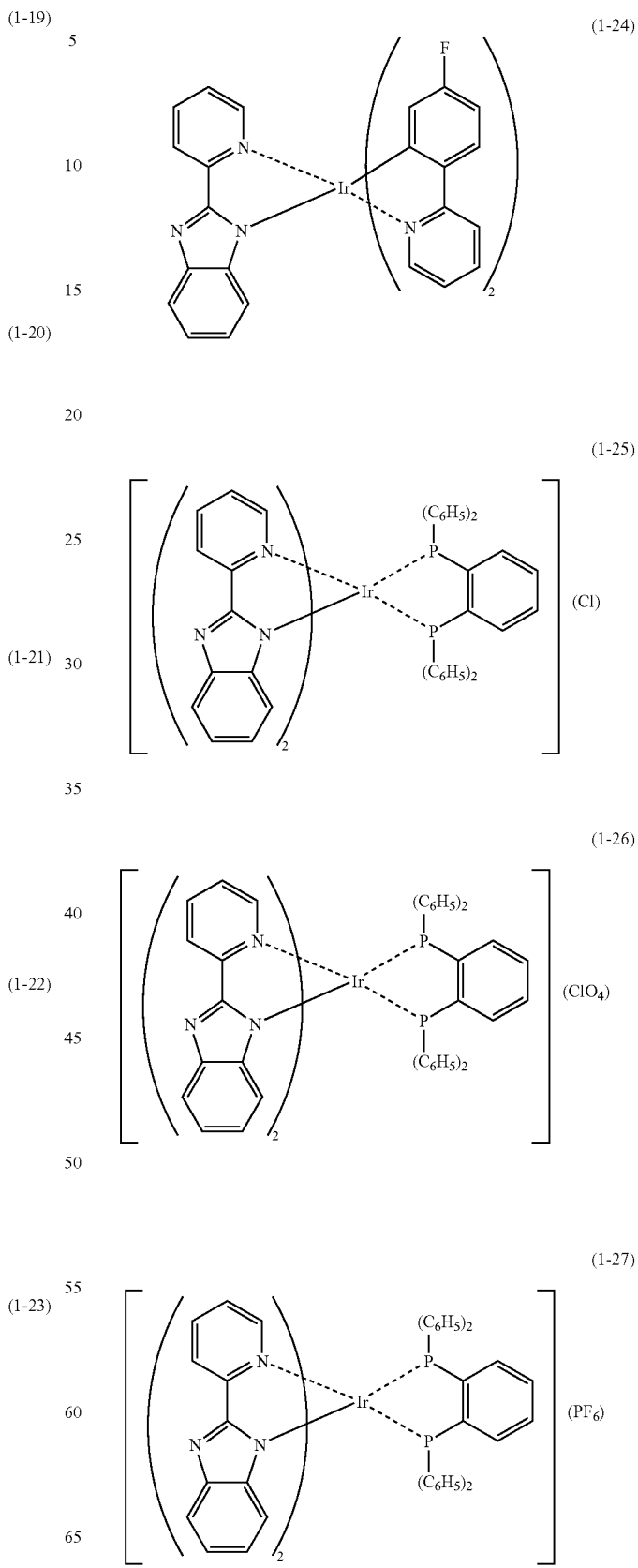

(1-28)
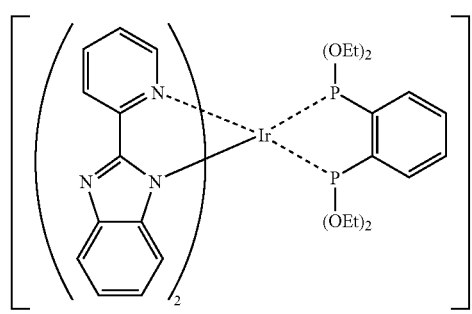 (ClO₄)
(1-29)
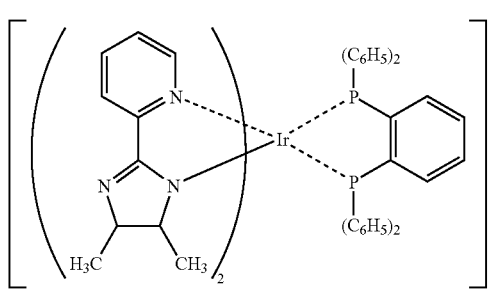 (ClO₄)
(1-30)
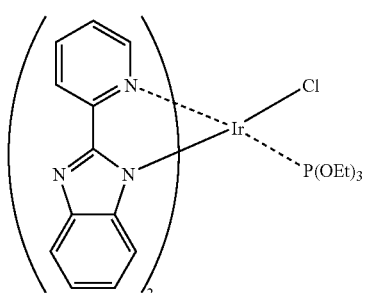
(1-31)
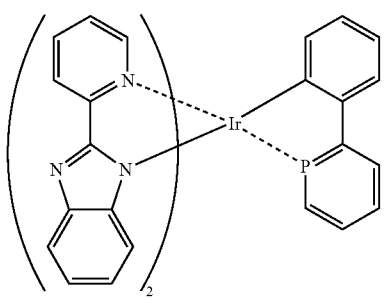
(1-32)
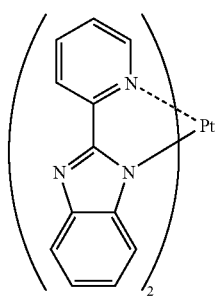
(1-33)
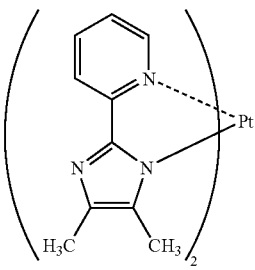
(1-34)
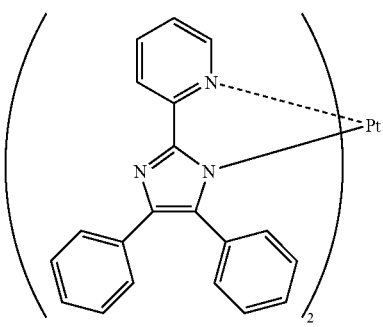
(1-35)
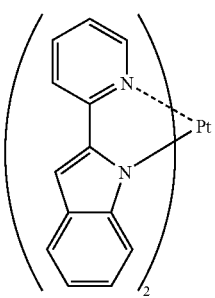
(1-36)
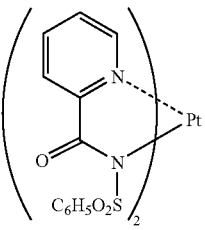
(1-37)
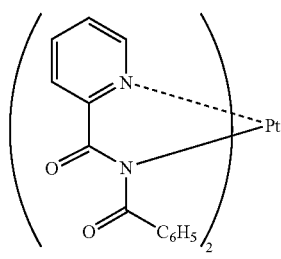

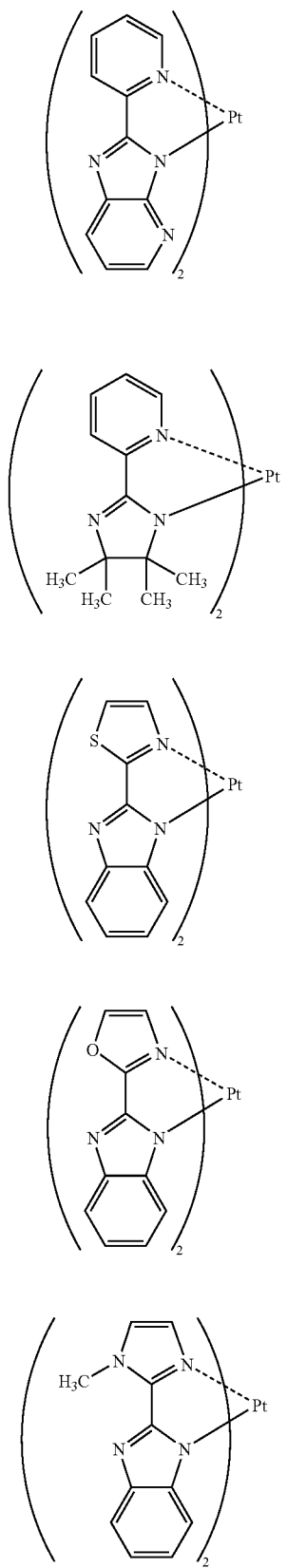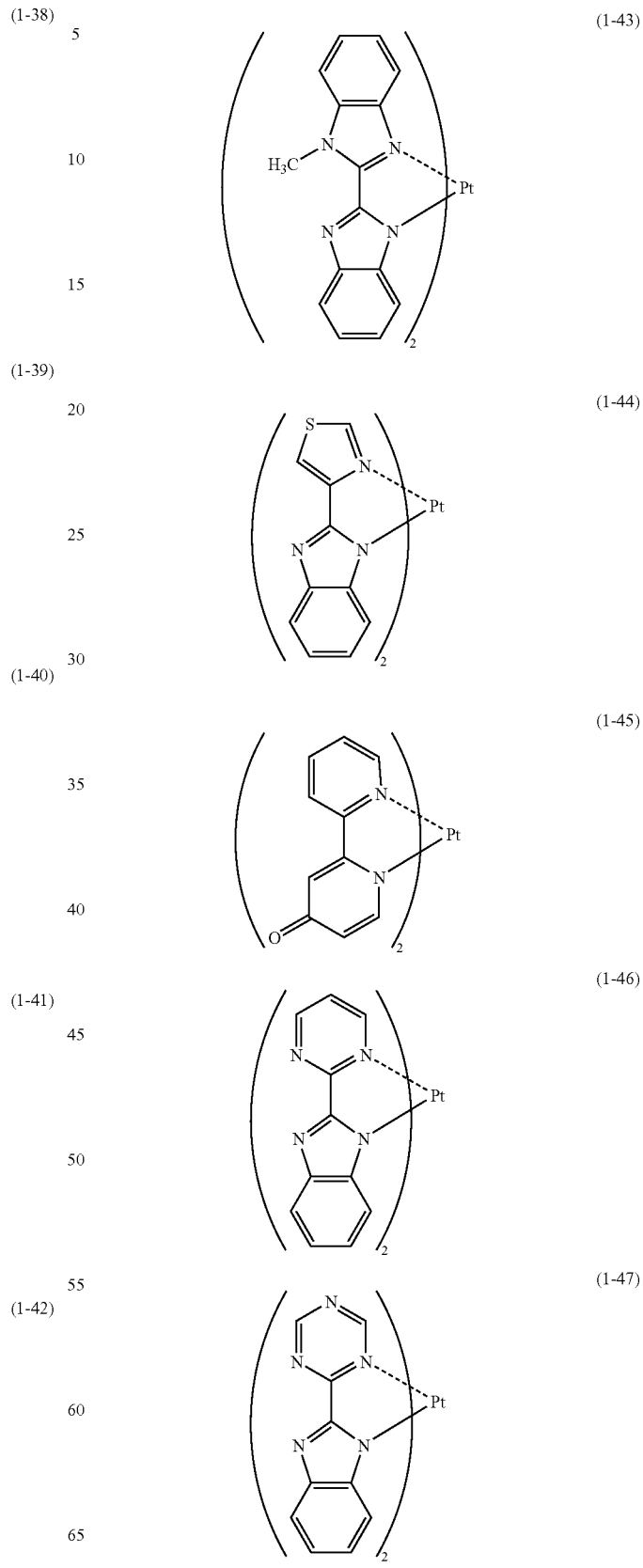

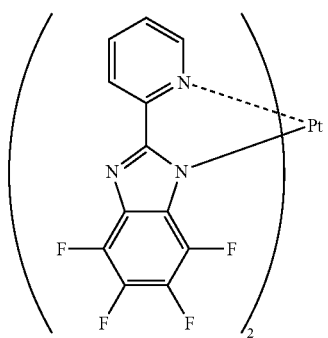
(1-48)
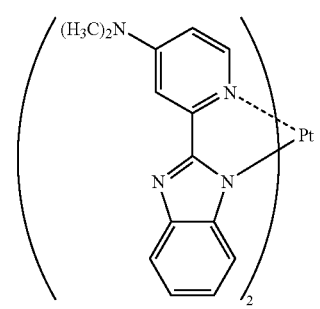
(1-49)
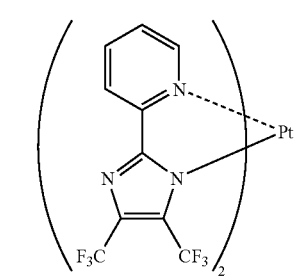
(1-50)
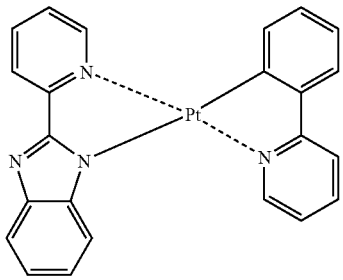
(1-51)
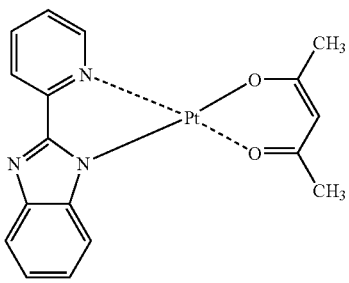
(1-52)
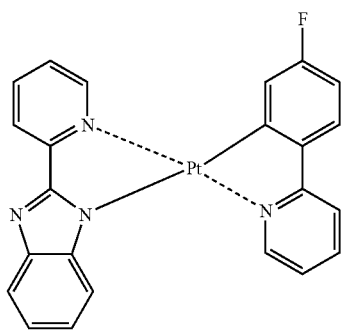
(1-53)
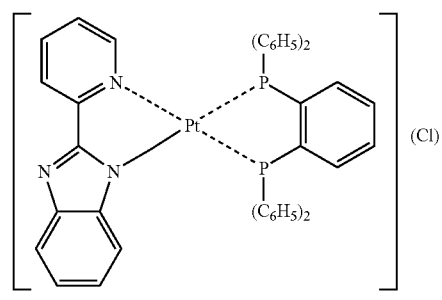
(1-54)
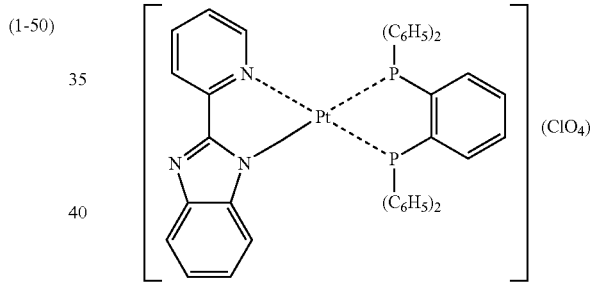
(1-55)
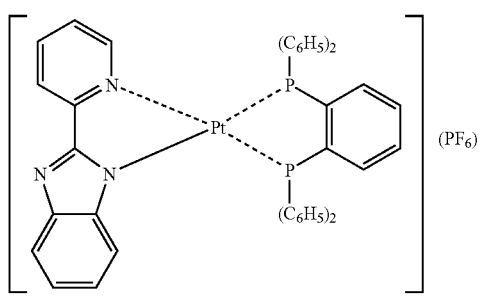
(1-56)
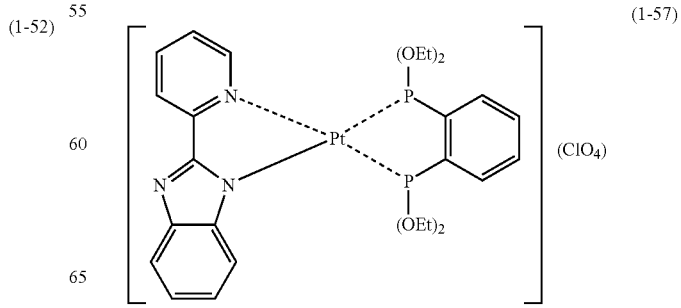
(1-57)

-continued
(1-58)
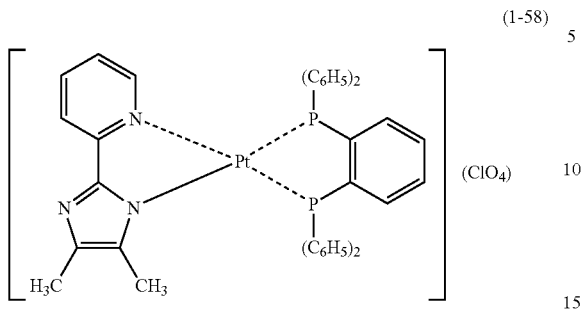
(1-59)
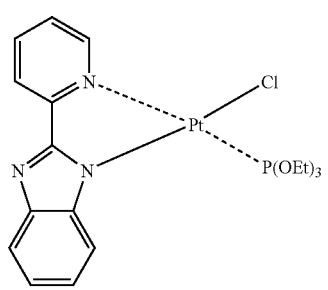
(1-60)
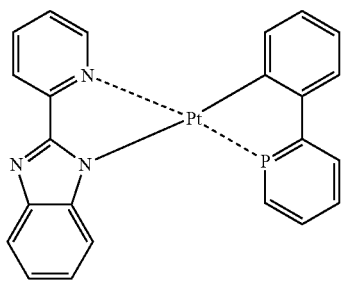
(1-61)
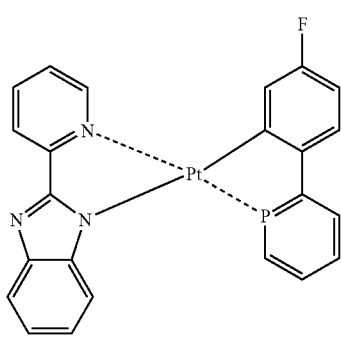
(1-62)
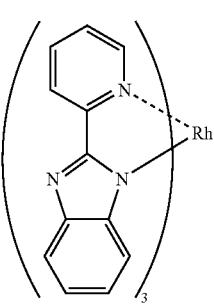
-continued
(1-63)
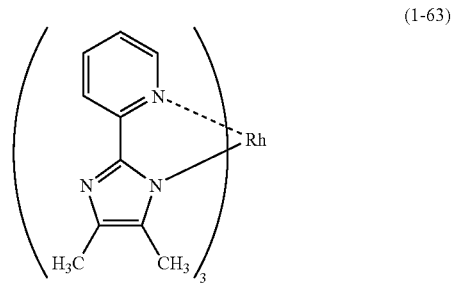
(1-64)
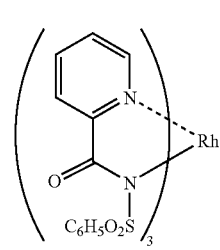
(1-65)
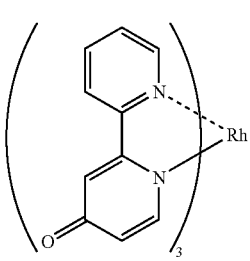
(1-66)
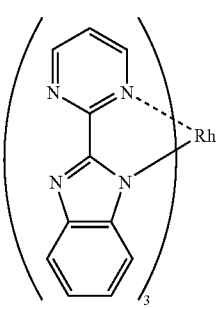
(1-67)
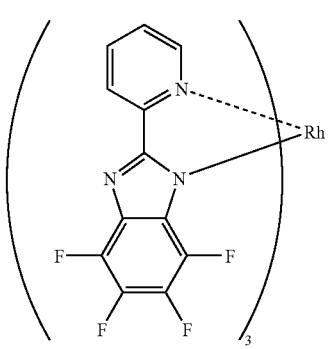

-continued
(1-68)
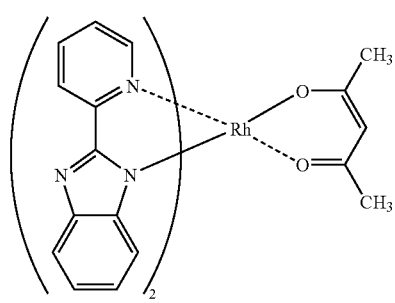
(1-69)
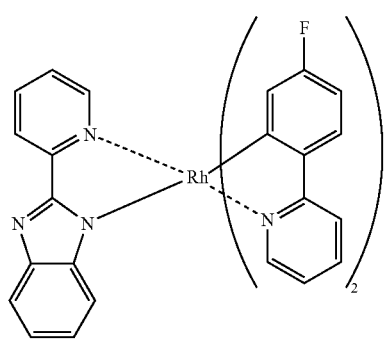
(1-70)
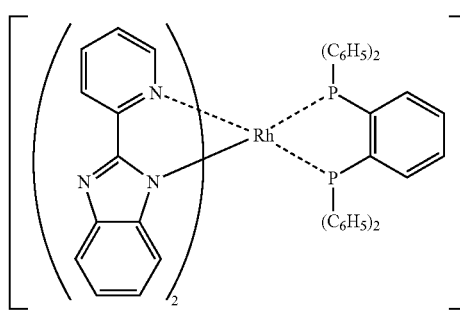 (ClO₄)
(1-71)
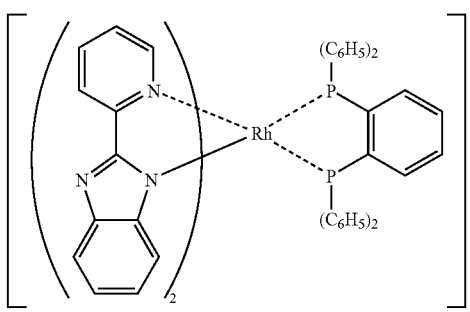 (PF₆)
(1-72)
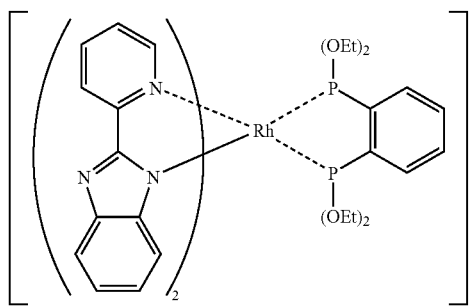 (ClO₄)
-continued
(1-73)
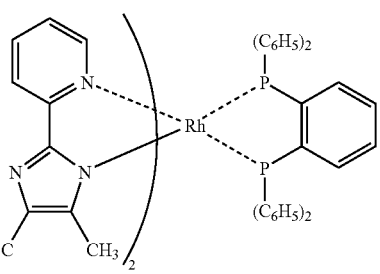 (ClO₄)
(1-74)
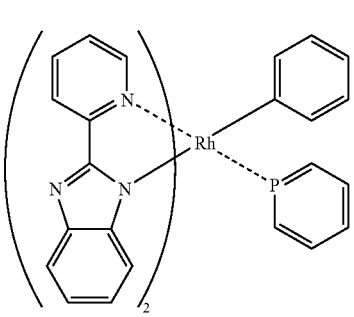
(1-75)
(1-76)
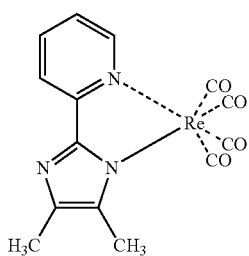
(1-77)
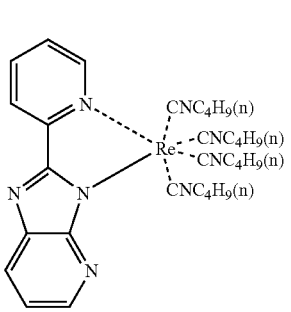

-continued
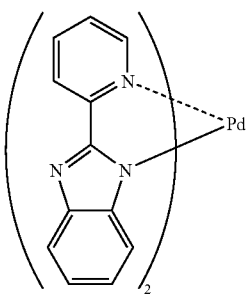
(1-78)
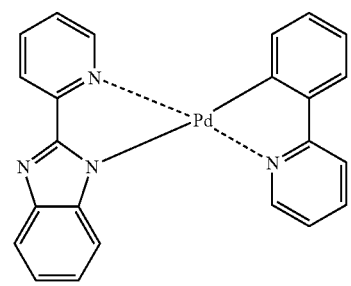
(1-79)
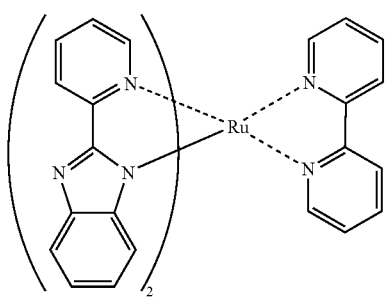
(1-80)
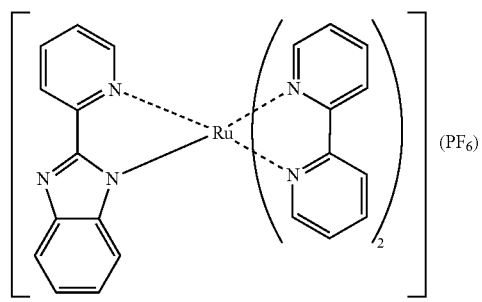
(1-81)
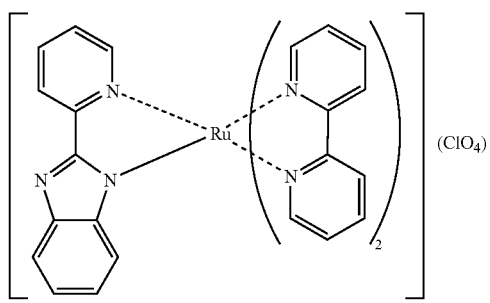
(1-82)
-continued
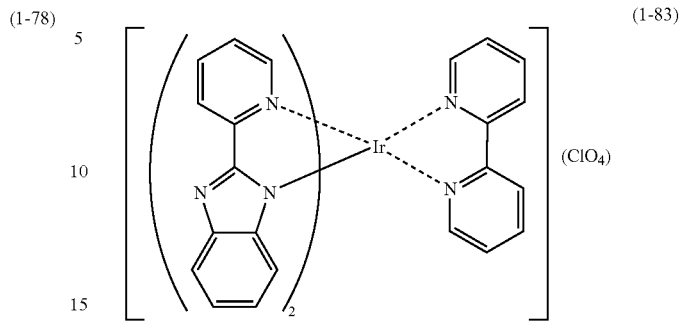
(1-83)
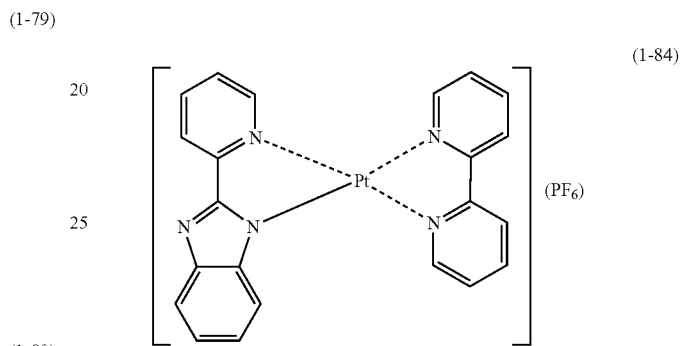
(1-84)
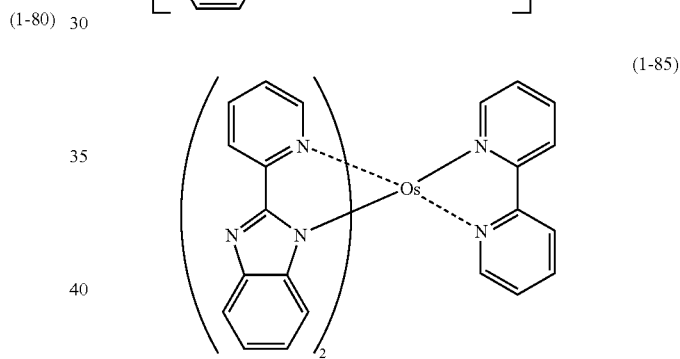
(1-85)
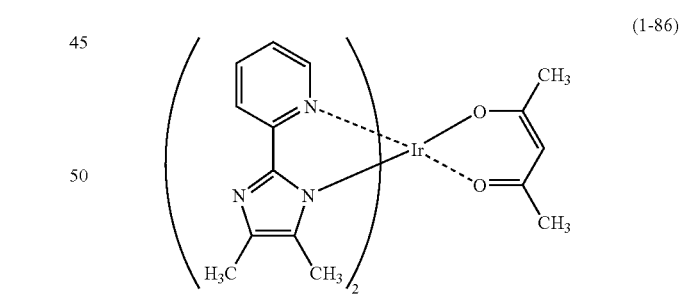
(1-86)
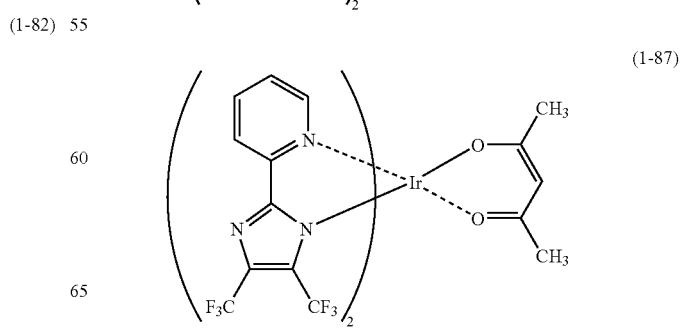
(1-87)

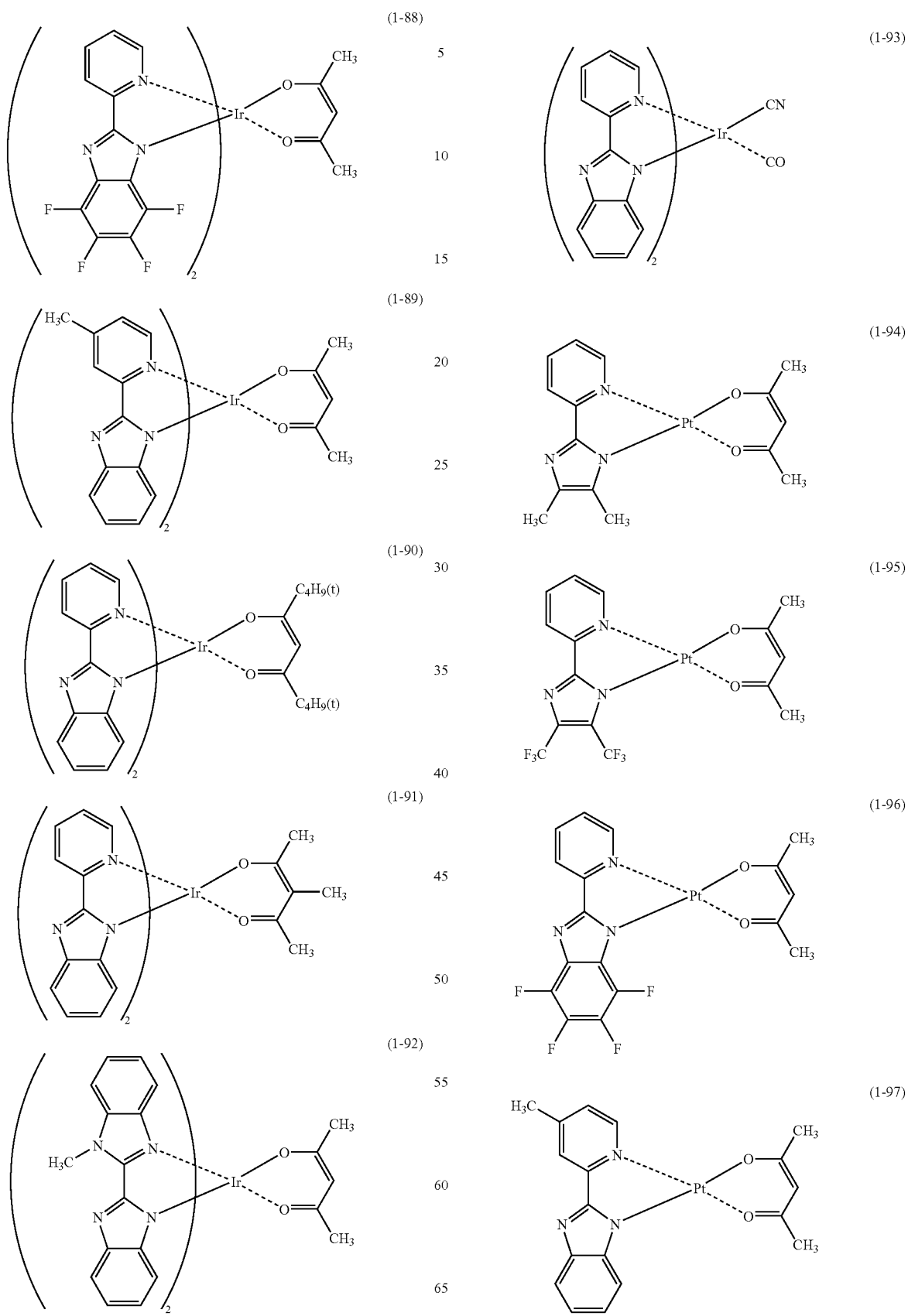

(1-98)
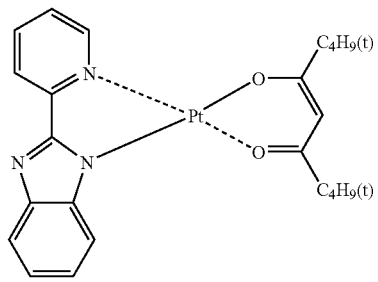
(1-99)
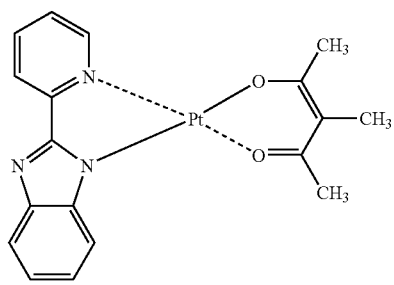
(1-100)
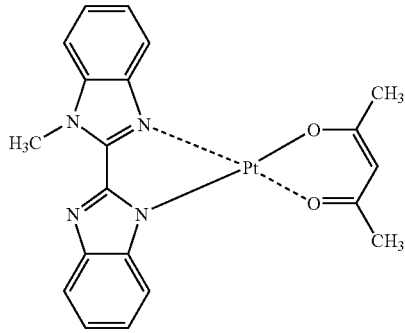
(1-101)
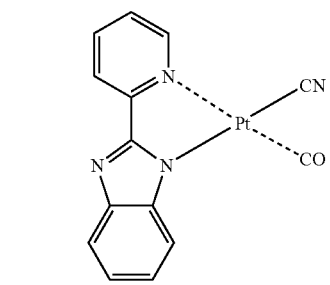
(1-102)
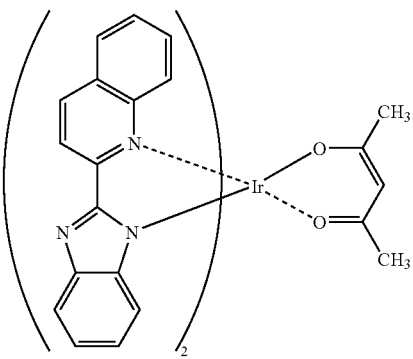
(1-201)
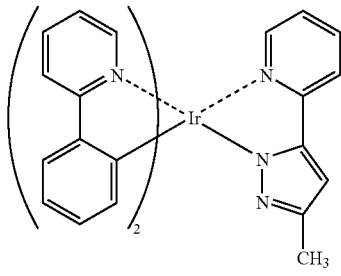
(1-202)
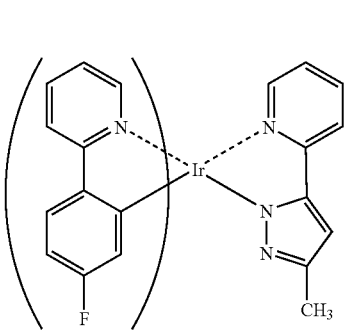
(1-203)
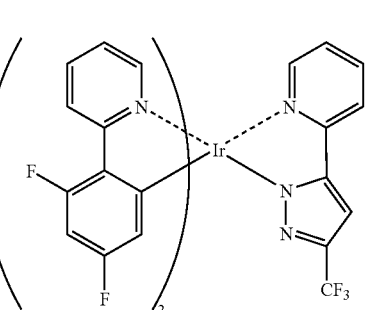
(1-204)
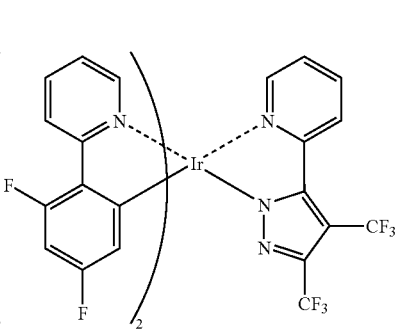
(1-205)
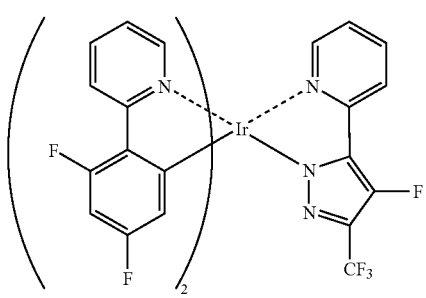

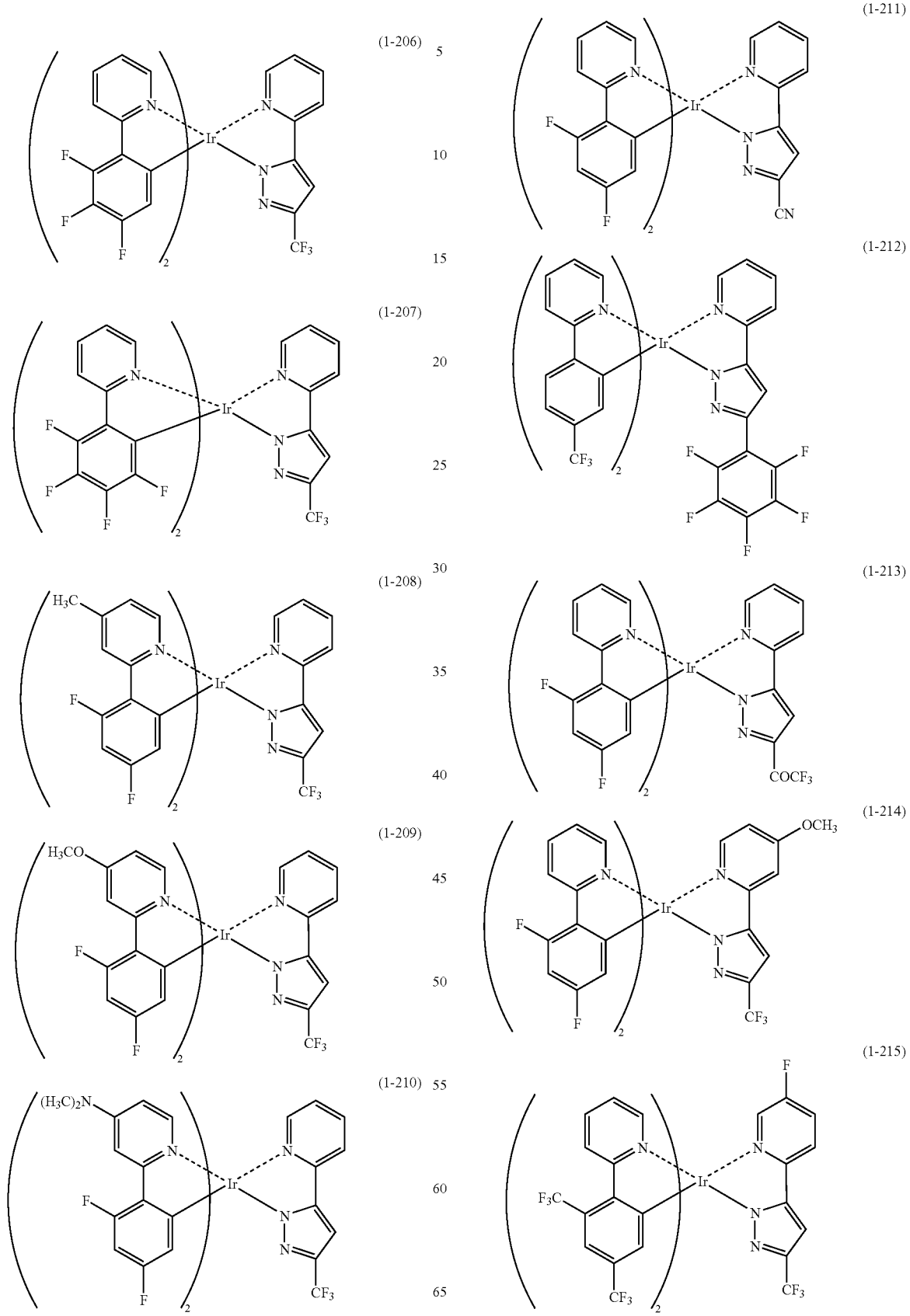

-continued
(1-216)
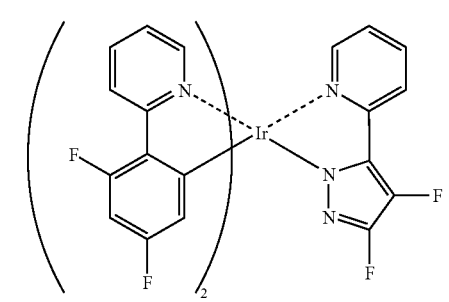
(1-217)
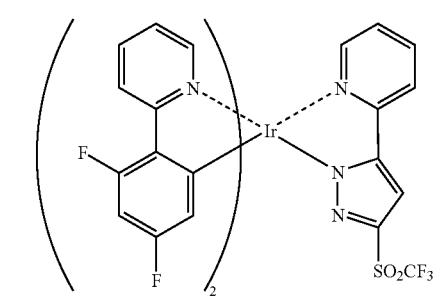
(1-218)
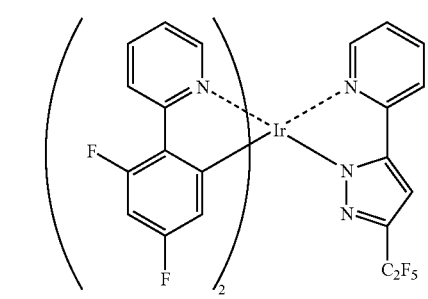
(1-219)
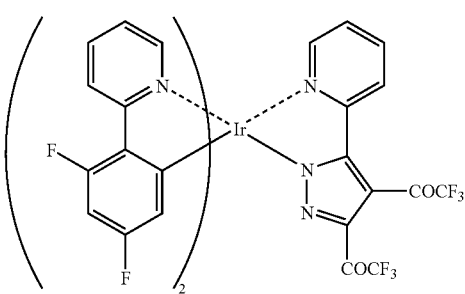
(1-220)
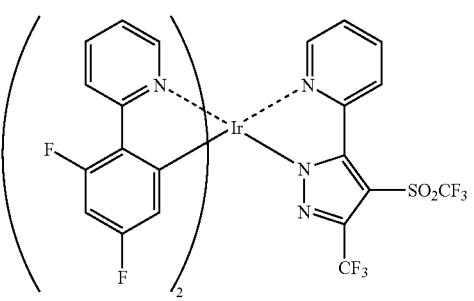
-continued
(1-221)
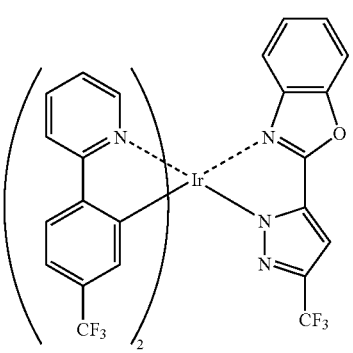
(1-222)
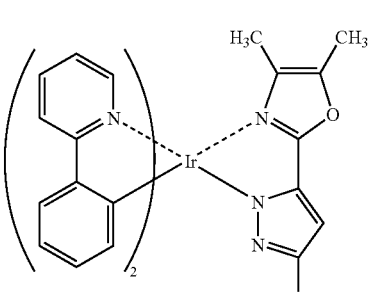
(1-223)
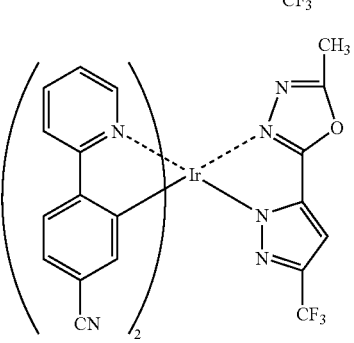
(1-224)
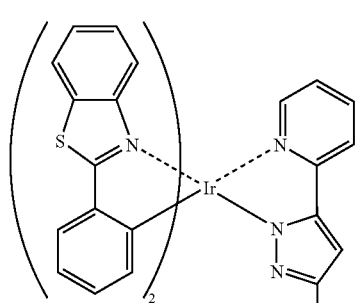
(1-225)
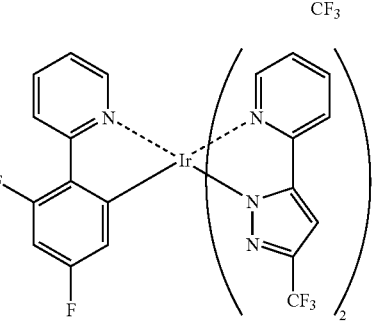

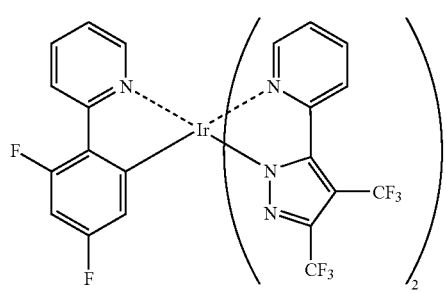
(1-226)
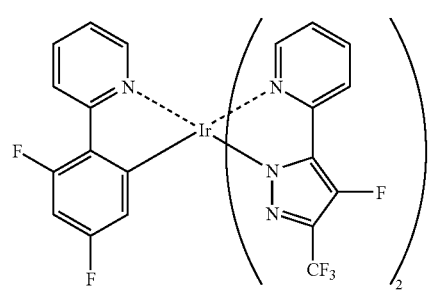
(1-227)
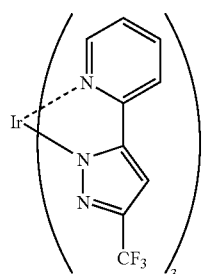
(1-228)
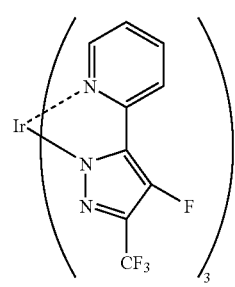
(1-229)
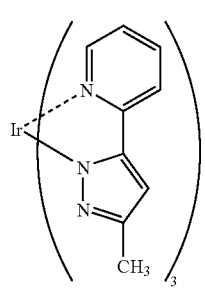
(1-230)
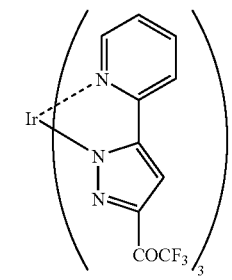
(1-231)
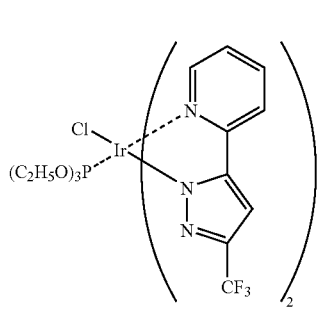
(1-232)
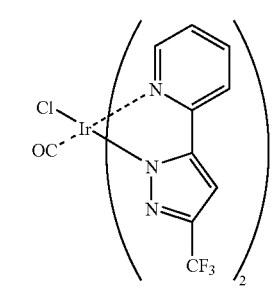
(1-233)
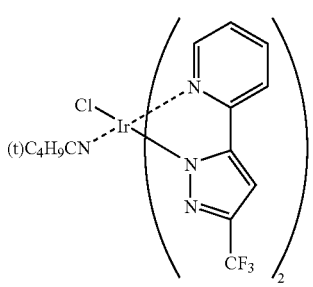
(1-234)
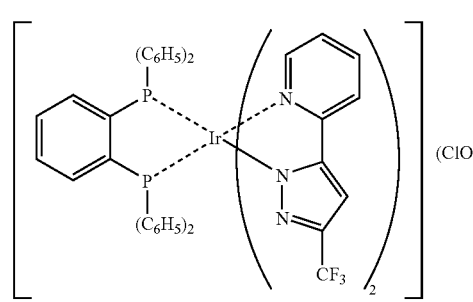
(1-235)

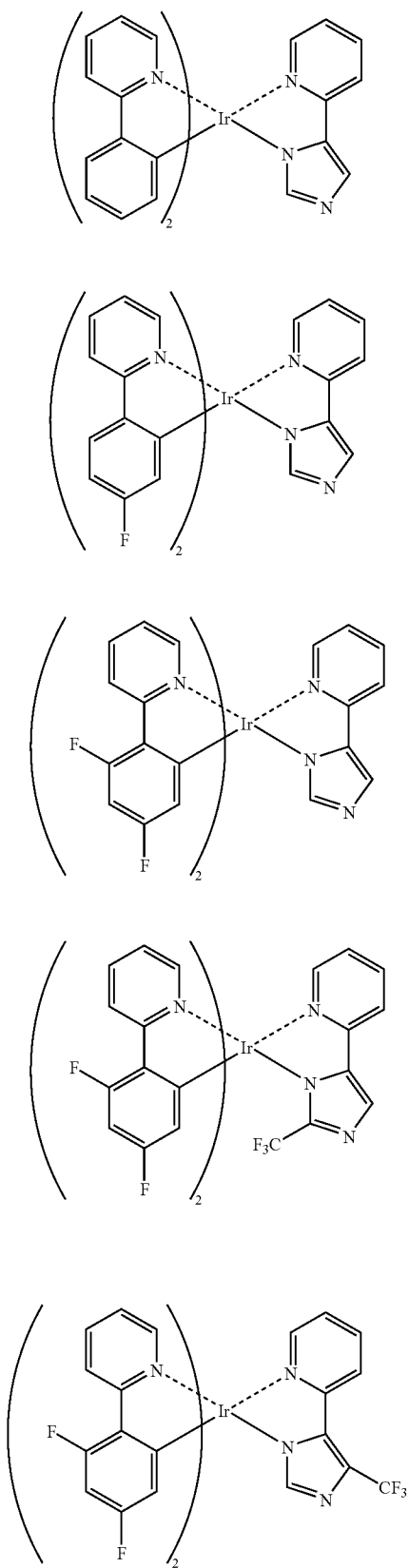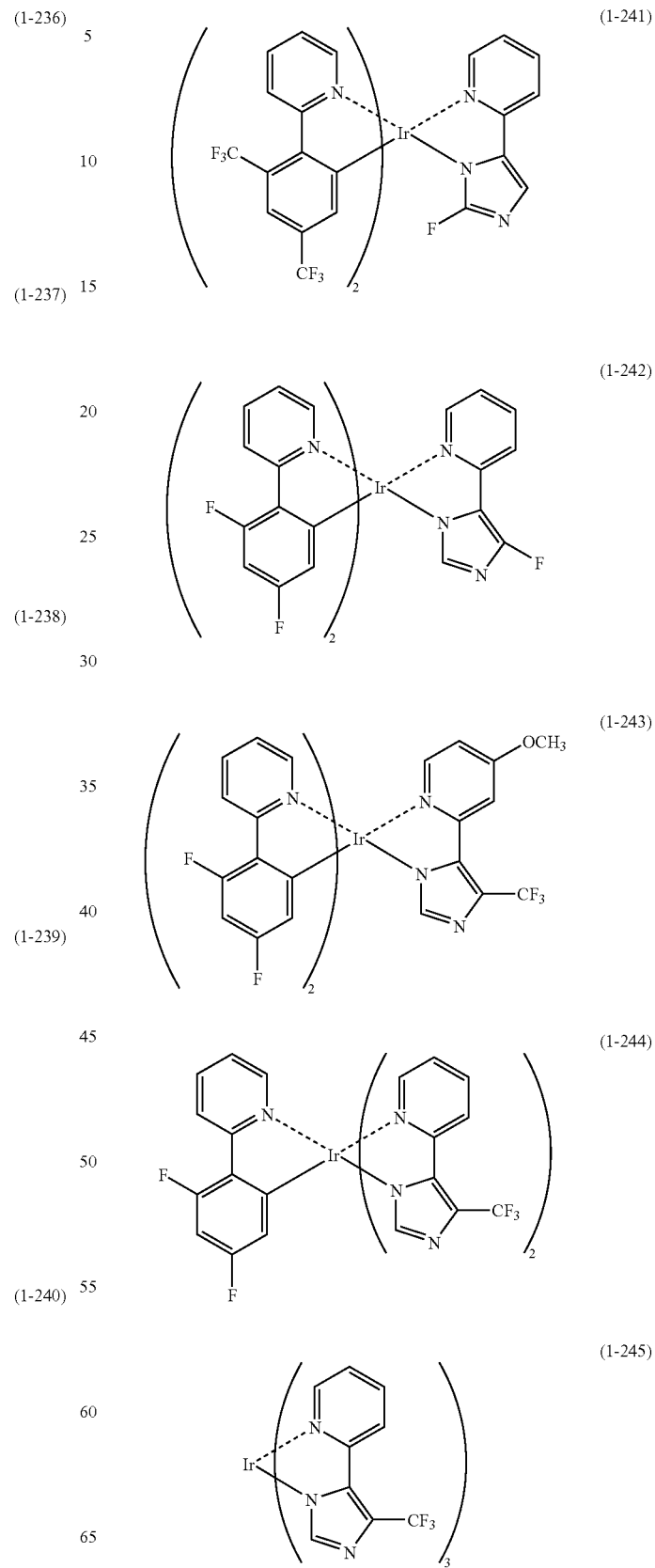

-continued
(1-246) 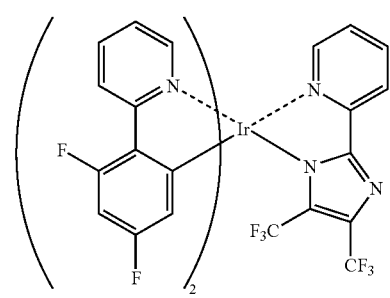
(1-247) 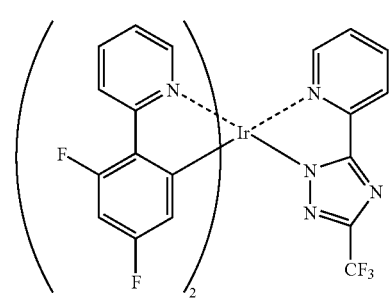
(1-248) 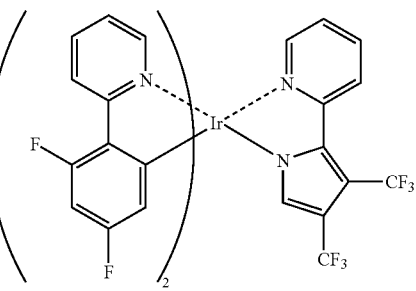
(1-249) 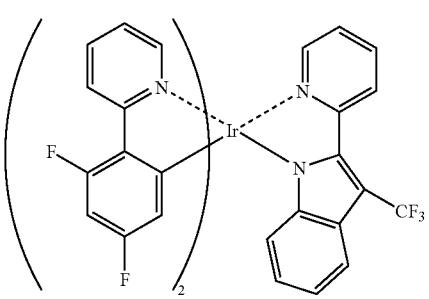
(1-250) 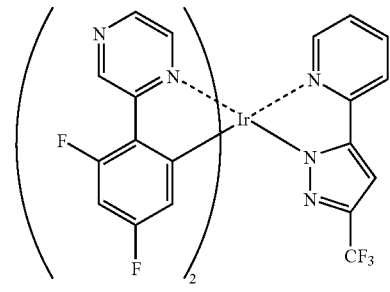
-continued
(1-251) 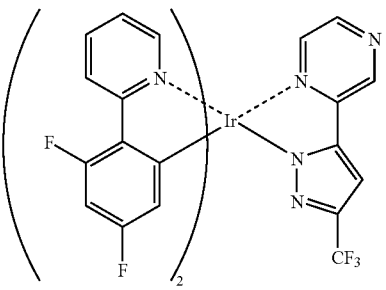
(1-252) 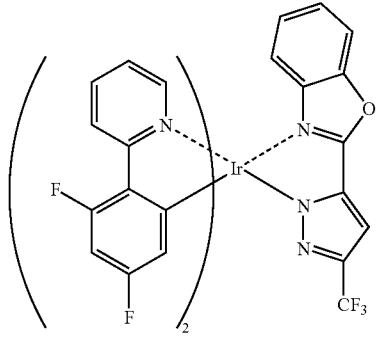
(1-253) 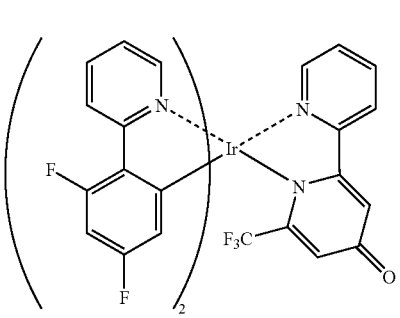
(1-254) 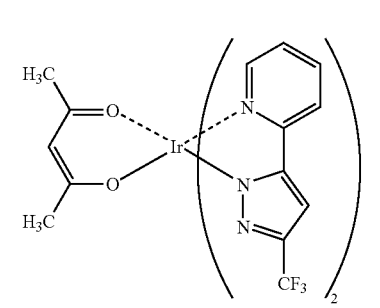
(1-255) 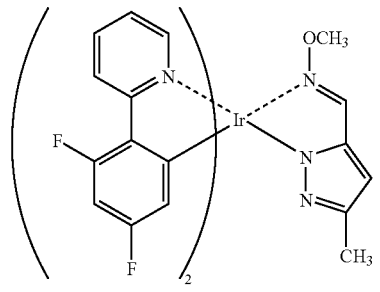

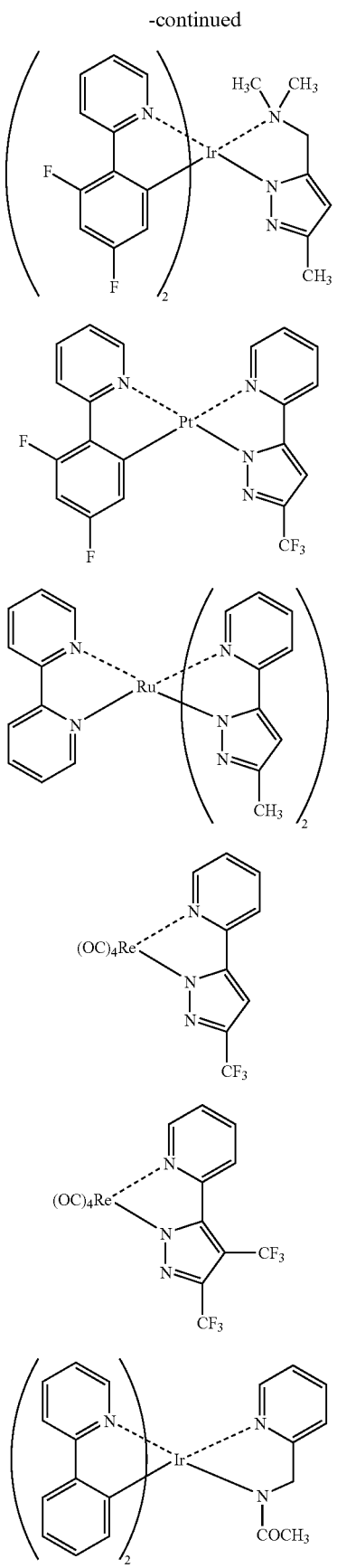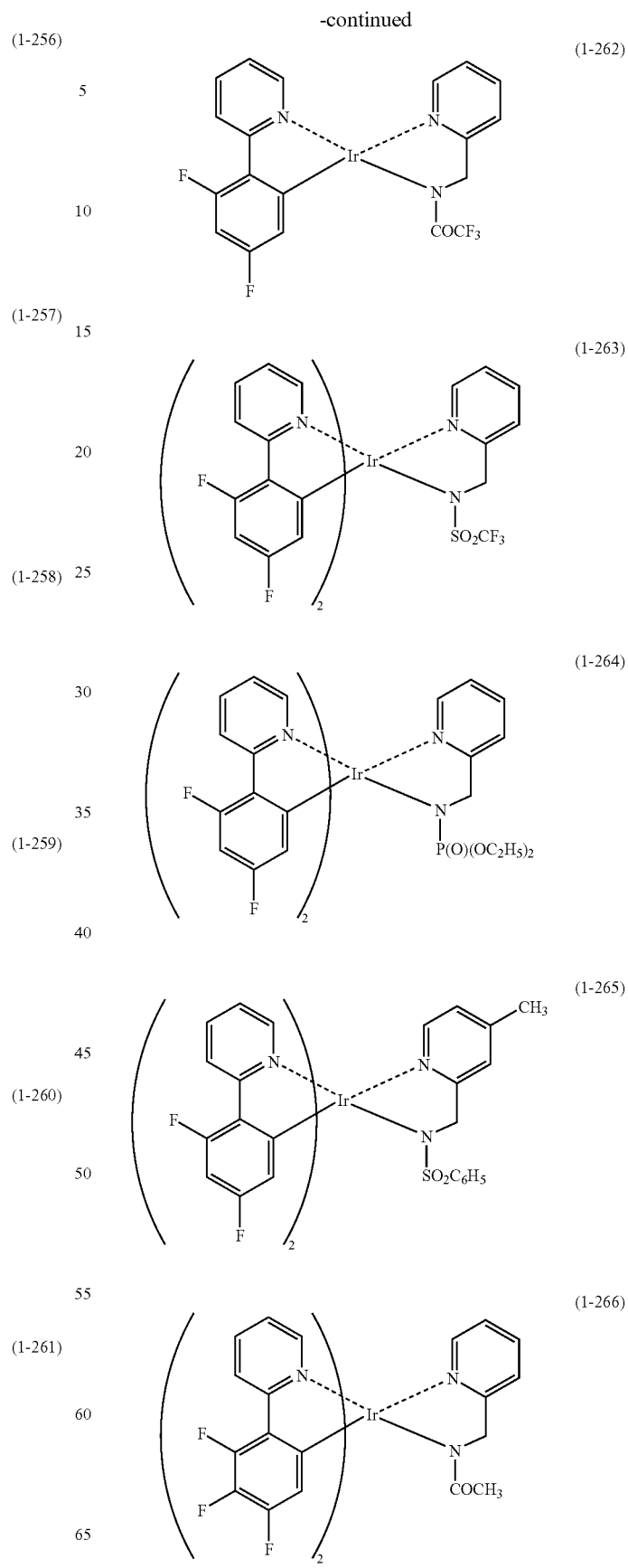

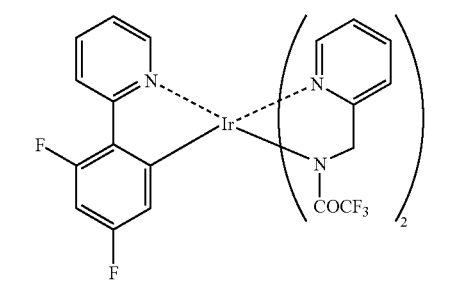
(1-267)
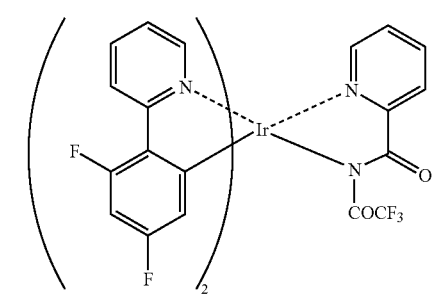
(1-268)
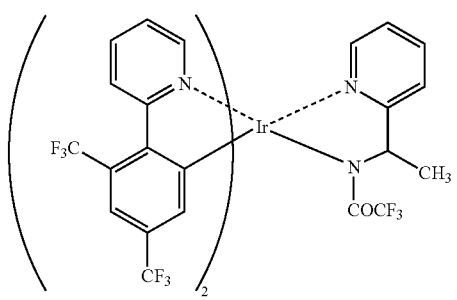
(1-269)
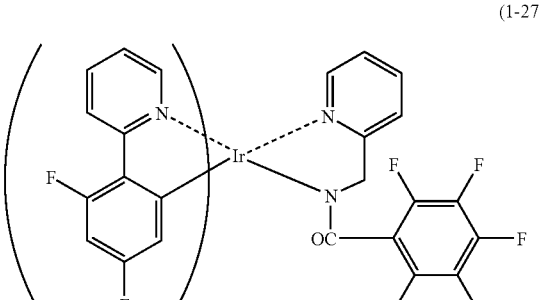
(1-270)
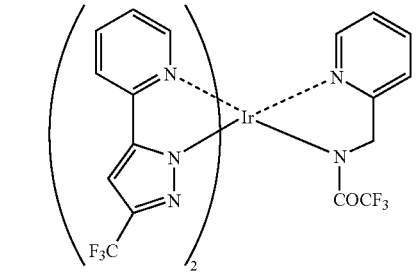
(1-271)
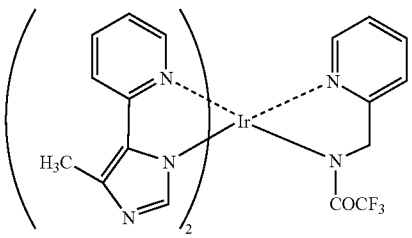
(1-272)
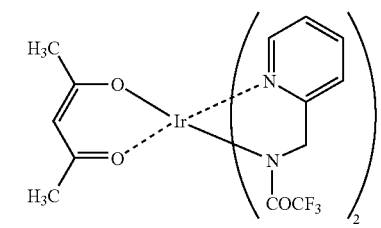
(1-273)
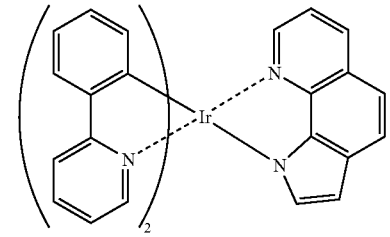
(1-274)
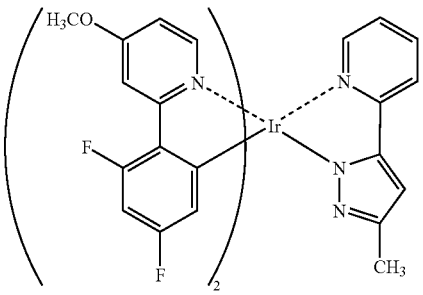
(1-301)
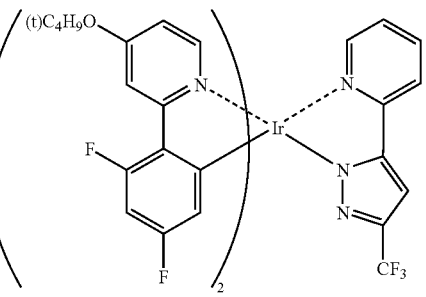
(1-302)
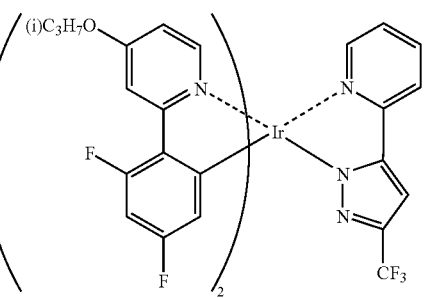
(1-303)

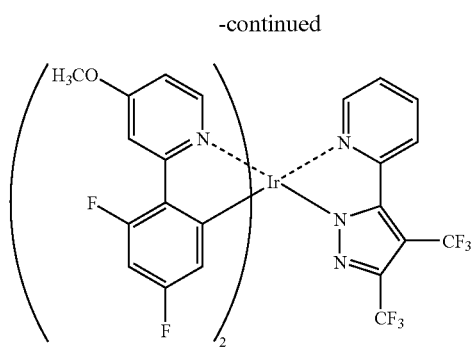 (1-304)
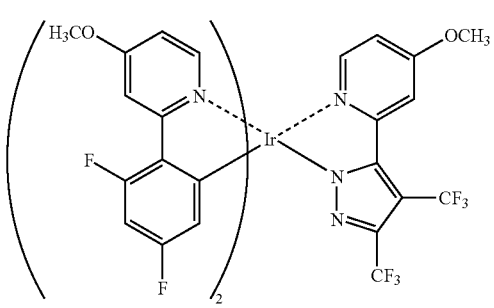 (1-305)
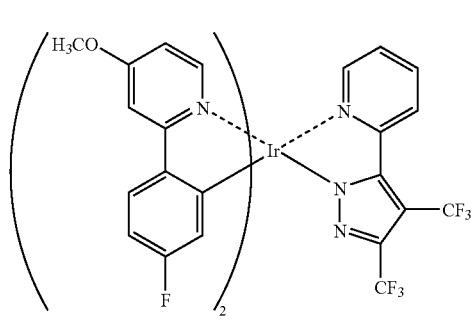 (1-306)
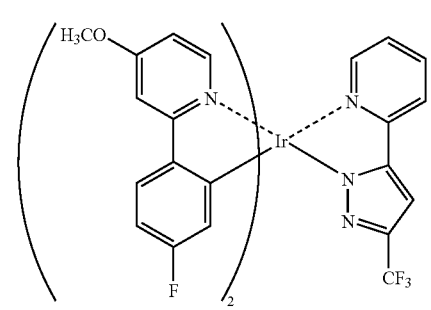 (1-307)
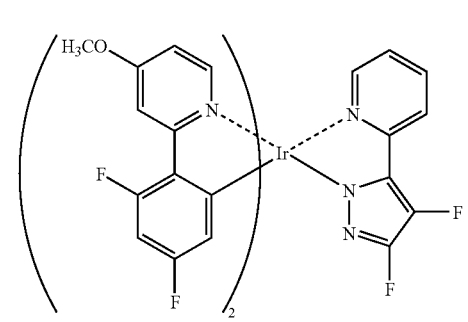 (1-308)
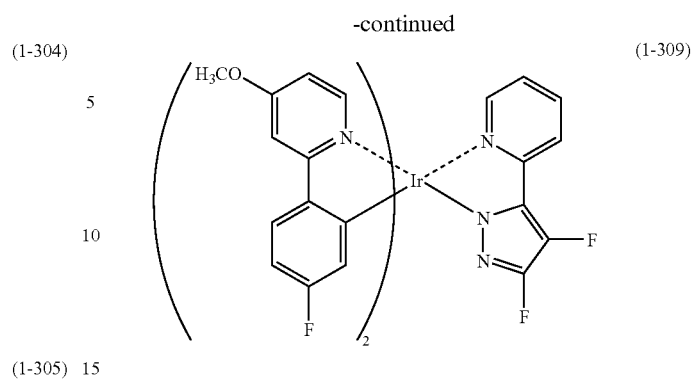 (1-309)
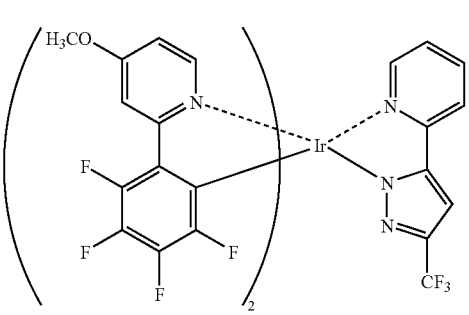 (1-310)
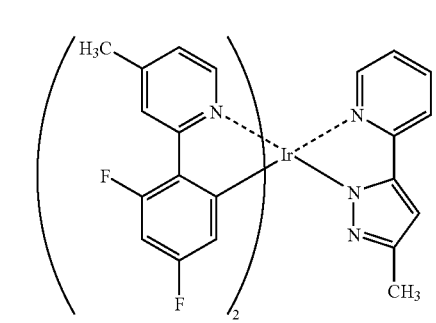 (1-311)
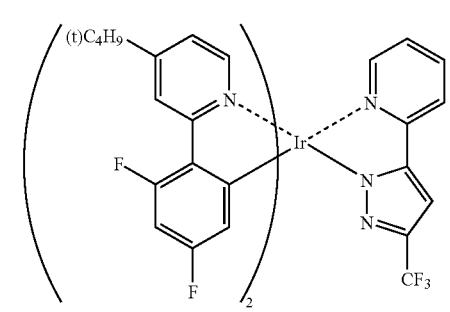 (1-312)
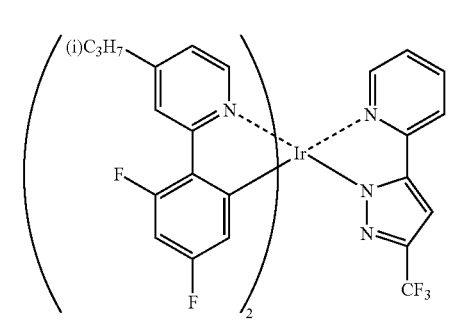 (1-313)

-continued
(1-314)
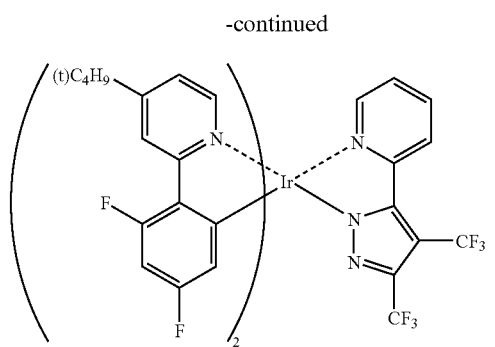
(1-315)
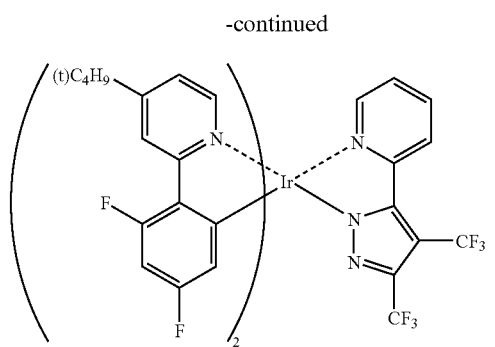
(1-316)
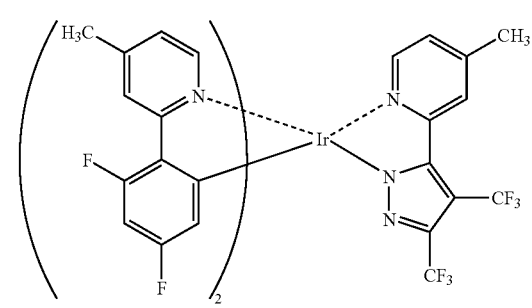
(1-317)
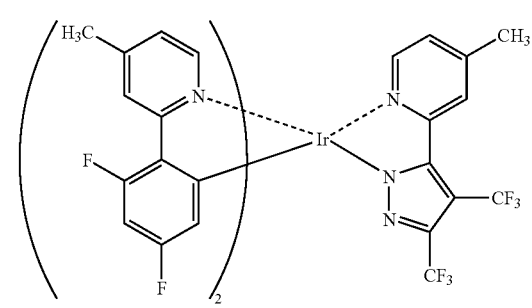
(1-318)
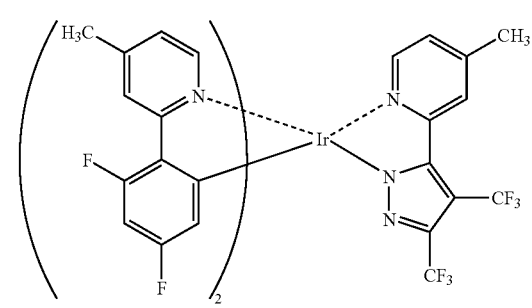
-continued
(1-319)
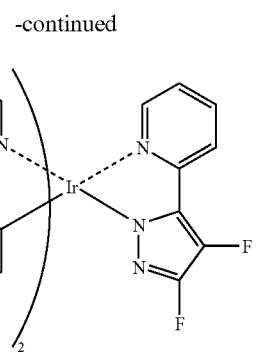
(1-320)
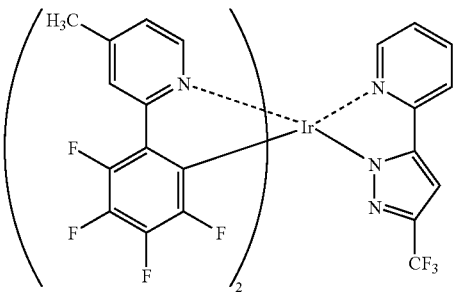
(1-321)
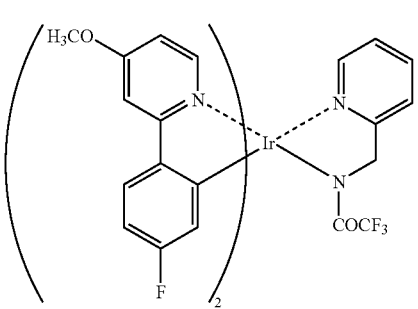
(1-322)
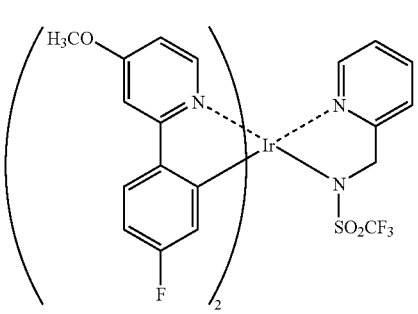
(1-323)
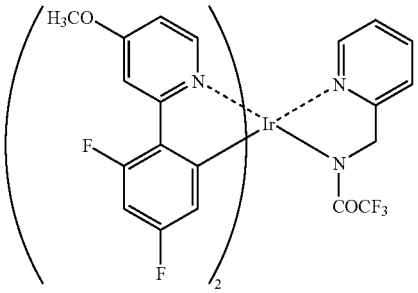

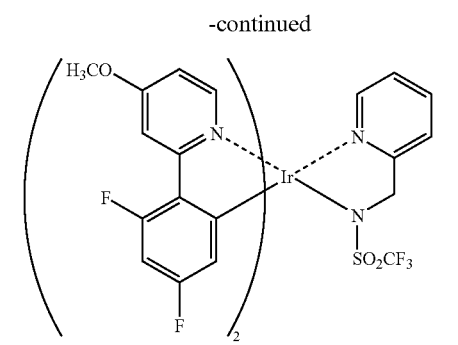
(1-324)
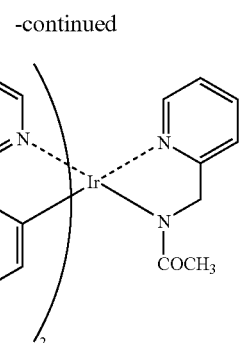
(1-329)
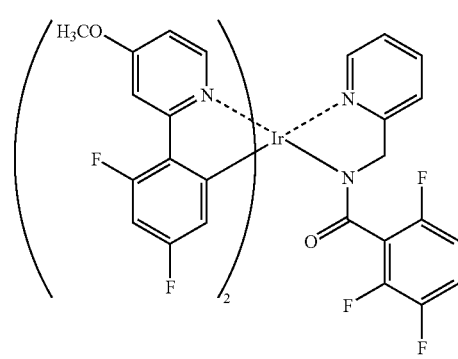
(1-325)
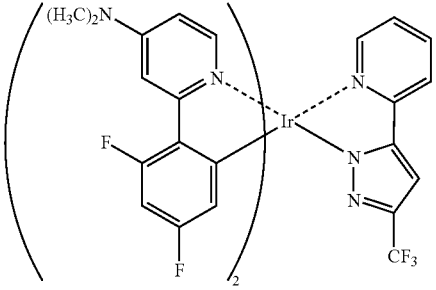
(1-330)
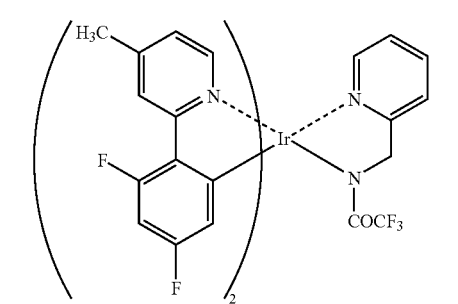
(1-326)
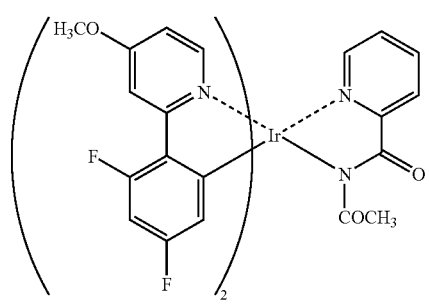
(1-331)
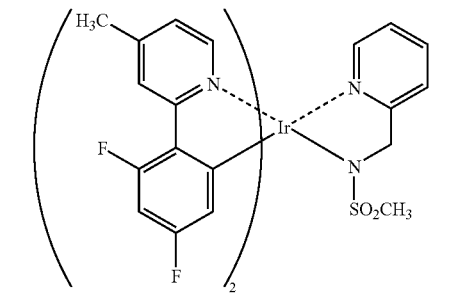
(1-327)
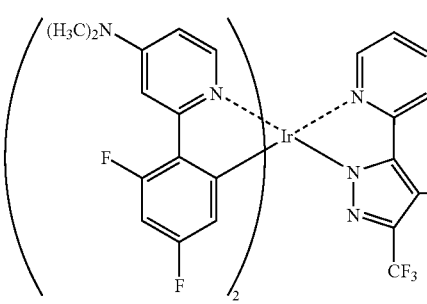
(1-332)
(1-328)
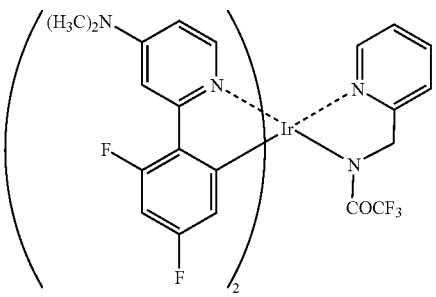
(1-333)

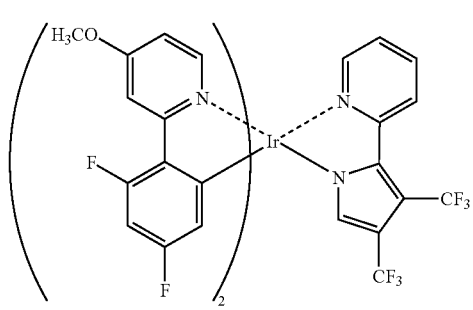 (1-334)
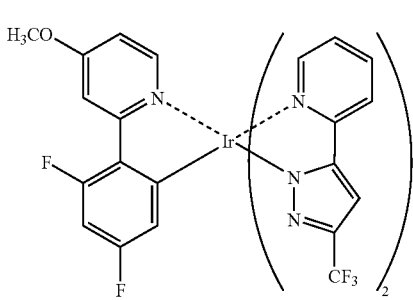 (1-339)
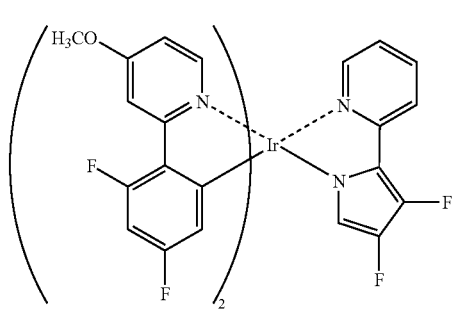 (1-335)
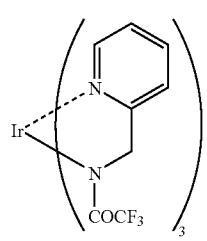 (1-340)
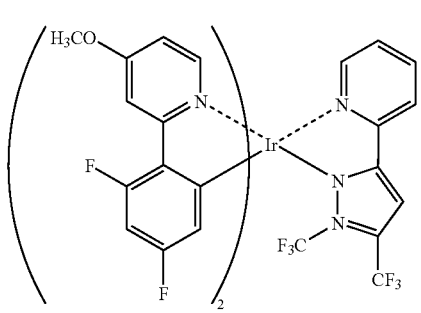 (1-336)
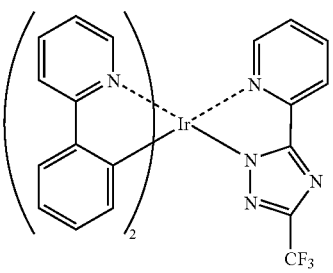 (1-341)
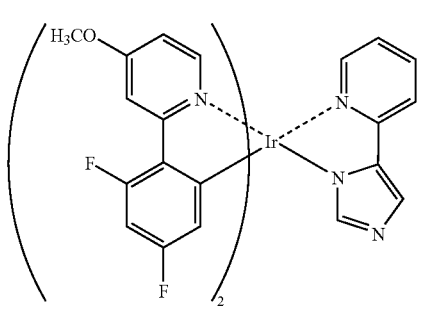 (1-337)
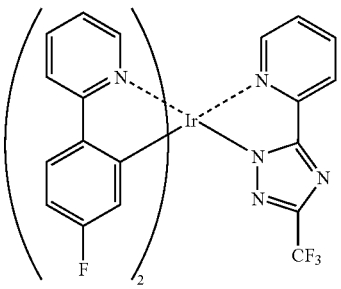 (1-342)
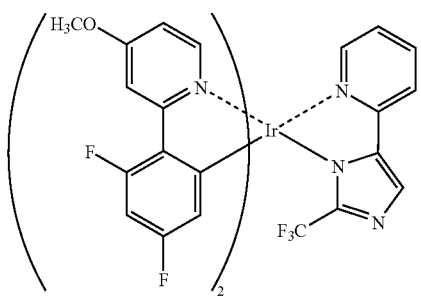 (1-338)
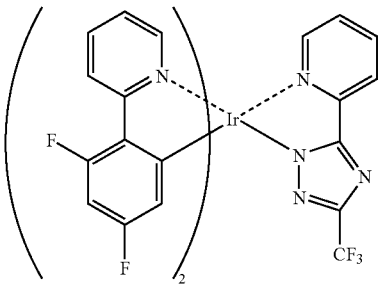 (1-343)

(1-344) 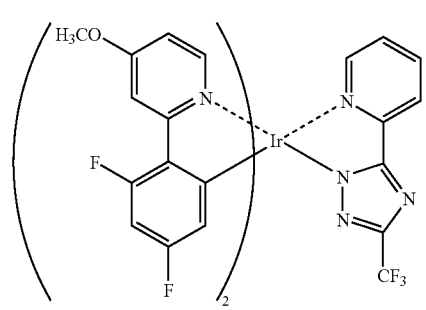
(1-345) 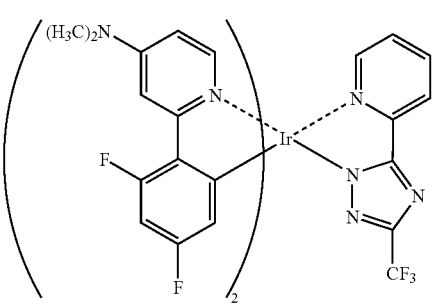
(1-346) 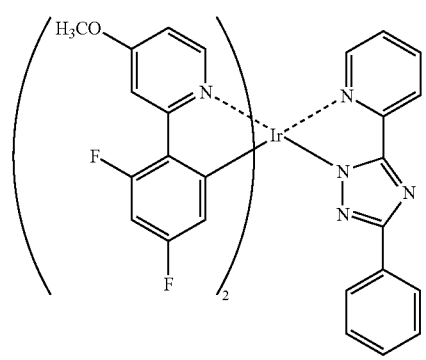
(1-347) 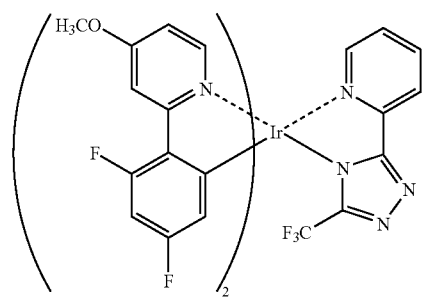
(1-348) 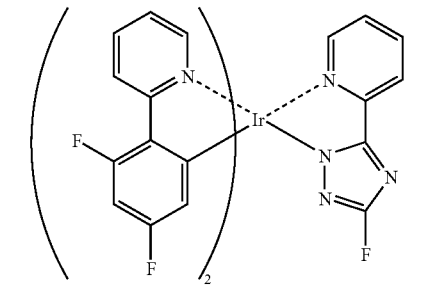
(1-349) 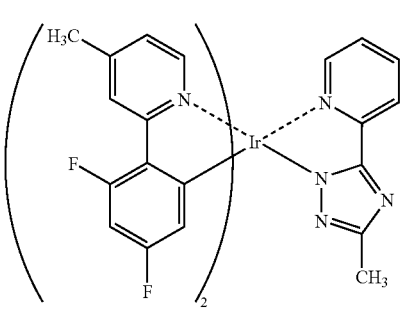
(1-350) 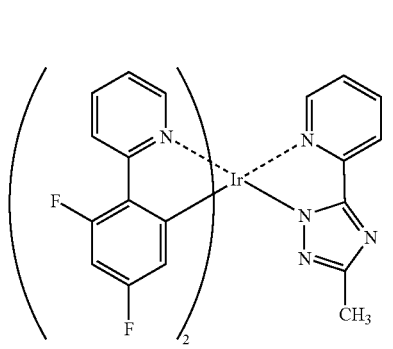
(1-351) 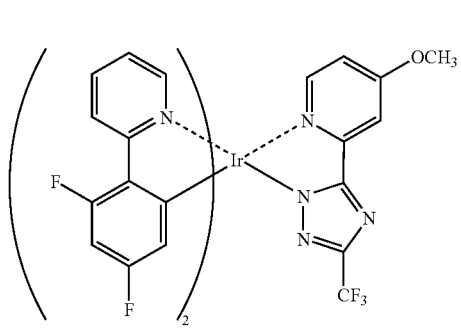
(1-352) 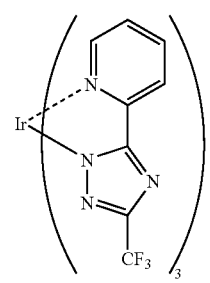
(1-353) 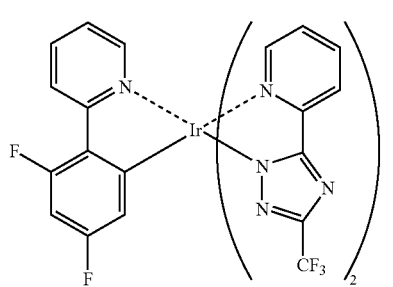

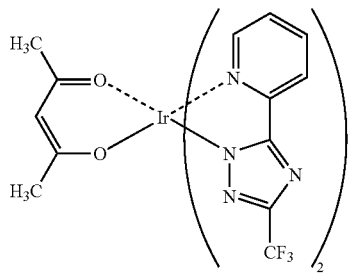

(1-354)

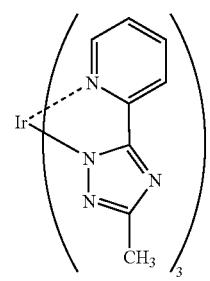

(1-355)

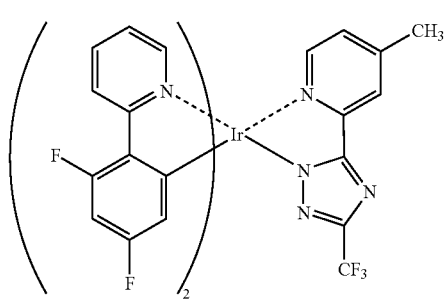

(1-356)

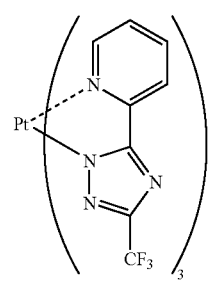

(1-357)

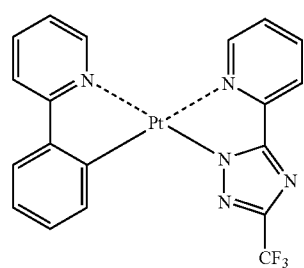

(1-358)

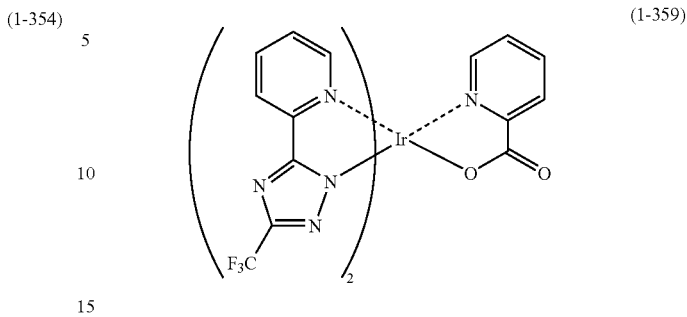

(1-359)

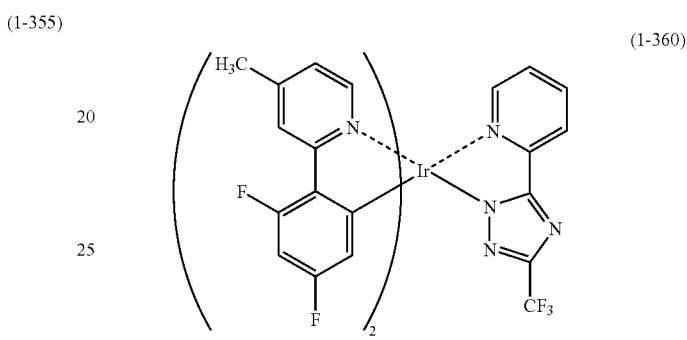

(1-360)

The transition metal complex (1) can be synthesized by various methods, for example, it may be prepared by mixing a ligand or a dissociation derivative thereof with a transition metal compound tinder a condition of heating or room temperature or less. Heating may be achieved by a general method, microwave, etc. A solvent (a halogenated solvent, an alcohol solvent, an ether solvent, water, etc.) and/or an inorganic or organic base (sodium methoxide, potassium t-butoxide, triethylamine, potassium carbonate, etc.) may be used for synthesis of the transition metal complex (1).

[2] Light-Emitting Device

A light-emitting device of the present invention comprises a pair of electrodes (positive electrode and negative electrode) and one or more organic layers including a light-emitting layer disposed between the electrodes. At least one of the organic layers comprises the above-mentioned transition metal complex (1). Although system utilizing the light-emitting device, a driving method therefor, use thereof, etc. are not particularly limited, the light-emitting device is preferably such that using the transition metal complex (1) as a light-emitting material or an electron-transporting material, more preferably such that using the transition metal complex (1) as a light-emitting material. An organic electroluminescence (EL) device is known as a typical light-emitting device.

In the light-emitting device of the present invention, it is preferable that the light-emitting layer comprises a host compound doped with the transition metal complex (1) acting as a guest compound. It is preferred that $T_1$ level of the host compound is larger than that of the guest compound, wherein "$T_1$ level" means an energy level at a lowest triplet excited state. The $T_1$ level of the host compound is preferably 260 to 356 kJ/mol (62 to 85 kcal/mol), more preferably 272 to 335 kJ/mol (65 to 80 kcal/mol).

It is preferred that $T_1$ level of a compound contained in a layer such as a hole-transporting layer, an electron-transporting layer, a hole-blocking layer, etc. adjacent to the light-emitting layer if larger than that of the guest compound contained in the light-emitting layer. The $T_1$ level of the compound contained in the layer adjacent to the light-emitting layer is preferably 260 to 356 kJ/mol (62 to 85 kcal/mol), more preferably 272 to 335 kJ/mol (65 to 80 kcal/mol). As the compound having such a $T_1$ level, compounds disclosed in Japanese Patent Application Nos. 2001-197135 and 2001-76704 are preferably used. Preferred embodiments of the compound are described in Japanese Patent Application Nos. 2001-197135 and 2001-76704.

Method for providing the organic layer comprising the transition metal complex (1) is not particularly limited, and the organic layer may be provided by a resistance heating vapor deposition method, an electron beam method, a sputtering method, a molecular stacking method, a coating method, an ink-jet method, a printing method, a transferring method, etc. Among the methods, preferred are the resistance heating vapor deposition method and the coating method from the viewpoints of simplification of production processes and properties of the light-emitting device.

The light-emitting device of the present invention may comprise a hole-injecting layer, a hole-transporting layer, an electron-injecting layer, an electron-transporting layer, a protective layer, etc. as the organic layer in addition to the light-emitting layer. These layers may have a plurality of functions. Although the transition metal complex (1) may be contained in any of the layers, the transition metal complex (1) is preferably used for the light-emitting layer or the charge-transporting layer, more preferably used for the light-emitting layer. Each component of the light-emitting device according to the present invention will be described in detail below.

(A) Positive Electrode

The positive electrode acts to supply holes to the hole-injecting layer, the hole-transporting layer, the light-emitting layer, etc. The positive electrode is made of a metal, an alloy, a metal oxide, an electrically conductive compound, a mixture thereof, etc., preferably made of a material having a work function of 4.0 eV or more. Examples of a material for the positive electrode include: metals such as gold, silver, chromium and nickel; electrically conductive metal oxides such as tin oxide, zinc oxide, indium oxide and ITO (Indium Tin Oxide); mixtures and laminations of the metal and the electrically conductive metal oxide; electrically conductive inorganic compounds such as copper iodide and copper sulfide; electrically conductive organic compounds such as polyaniline, polythiophene and polypyrrole; laminations of the electrically conductive organic compound and ITO; etc. Among the materials, preferred are the electrically conductive metal oxides, particularly preferred is ITO from the viewpoints of productivity, electroconductivity, transparency, etc.

Method for providing the positive electrode may be selected depending on the material used therefor. For example, the positive electrode made of ITO may be formed by an electron beam method, a sputtering method, a resistance heating vapor deposition method, a chemical reaction method such as a sol-gel method, a coating method using a dispersion containing indium tin oxide, etc. The positive electrode may be subjected to a washing treatment, etc., to lower the driving voltage, or to increase the light-emitting efficiency of the light-emitting device. For example, in the case of the positive electrode made of ITO, UV-ozone treatment and plasma treatment are effective. Sheet resistance of the positive electrode is preferably a few hundred Ω/square or less. Although thickness of the positive electrode may be appropriately selected depending on the material used therefor, generally, the thickness is preferably 10 nm to 5 μm, more preferably 50 nm to 1 μm, particularly preferably 100 to 500 nm.

The positive electrode is generally disposed on a substrate made of a soda lime glass, a non-alkali glass, a transparent resin, etc. The glass substrate is preferably made of the non-alkali glass to reduce ion elution. In the case of using the soda lime glass, it is preferred that the substrate is coated with silica, etc. beforehand. Thickness of the substrate is not particularly limited if only it has sufficient strength. In the case of the glass substrate, the thickness is generally 0.2 mm or more, preferably 0.7 mm or more.

(B) Negative Electrode

The negative electrode acts to supply electrons to the electron-injecting layer, the electron-transporting layer, the light-emitting layer, etc. Material for the negative electrode may be selected from metals, alloys, metal halides, metal oxides, electrically conductive compounds, mixtures thereof, etc. correspondingly to ionization potential, stability, adhesion property with a layer adjacent to the negative electrode such as the light-emitting layer, etc. Examples of the material for the negative electrode include: alkali metals such as Li, Na and K, and fluorides and oxides thereof; alkaline earth metals such as Mg and Ca, and fluorides and oxides thereof; gold; silver; lead; aluminum; alloys and mixtures of sodium and potassium; alloys and mixtures of lithium and aluminum; alloys and mixtures of magnesium and silver; rare earth metals such as indium and ytterbium; mixtures thereof; etc. The negative electrode is preferably made of a material having a work function of 4.0 eV or less, more preferably made of aluminum, an alloy or a mixture of lithium and aluminum, or an alloy and a mixture of magnesium and silver.

The negative electrode may have a single-layer structure or a multi-layer structure. Preferred multi-layer structure is aluminum/lithium fluoride, aluminum/lithium oxide, etc. The negative electrode may be provided by an electron beam method, a sputtering method, a resistance heating vapor deposition method, a coating method, etc. A plurality of materials may be simultaneously deposited. The negative electrode of an alloy may be formed by simultaneously depositing a plurality of metals, or by depositing an alloy prepared beforehand. Sheet resistance of the negative electrode is preferably a few hundred Ω/square or less. Although thickness of the negative electrode may be appropriately selected depending on the material used therefor, generally, the thickness is preferably 10 nm to 5 μm, more preferably 50 nm to 1 μm, particularly preferably 100 nm to 1 μm.

(C) Hole-Injecting Layer and Hole-Transporting Layer

The hole-injecting material and the hole-transporting material used for the hole-injecting layer and the hole-transporting layer are not particularly limited if they have any function of: injecting the holes provided from the positive electrode into the light-emitting layer; transporting the holes to the light-emitting layer; and blocking the electrons provided from the negative electrode. Examples of the hole-injecting material and the hole-transporting material include carbazole, triazole, oxazole, oxadiazole, imidazole, polyarylalkanes, pyrazoline, pyrazolone, phenylenediamine, arylamines, amino-substituted chalcone, styrylanthracene, fluorenone, hydrazone, stilbene, silazane, aromatic tertiary amine compounds, styrylamine compounds, aromatic dimethylidyne compounds, porphyrin compounds, polysilane compounds, poly(N-vinylcarbazole), aniline copolymers, electrically conductive polymers and oligomers such as oligothiophenes and polythiophenes, organic silane compounds, carbon, the transition metal complex (1), derivatives and mixtures thereof, etc.

Each of the hole-injecting layer and the hole-transporting layer may have a structure of single-layer made of one or more materials, or multi-layers made of the same material or different materials. The hole-injecting layer and the hole-transporting layer may be formed by a vacuum deposition method, an LB method, an ink-jet method, a printing method, a transferring method, a coating method using a solution or a dispersion containing the above material such as a spin-coating method, a casting method and a dip-coating method, etc.

The solution and the dispersion used in the coating method may contain a resin. Examples of the resin include poly(vinyl chloride), polycarbonates, polystyrene, poly(methyl methacrylate), poly(butyl methacrylate), polyesters, polysulfones, poly(phenylene oxide), polybutadiene, poly(N-vinylcarbazole), hydrocarbon resins, ketone resins, phenoxy resins, polyamides, ethyl celluloses, poly(vinyl acetate), ABS resins, polyurethanes, melamine resins, unsaturated polyester resins, alkyd resins, epoxy resins, silicone resins, etc. Although the thickness of each of the hole-injecting layer and the hole-transporting layer is not particularly limited, generally, the thickness is preferably 1 nm to 5 µm, more preferably 5 nm to 1 µm, particularly preferably 10 to 500 nm.

(D) Light-Emitting Layer

In the light-emitting layer, holes injected from the positive electrode, the hole-injecting layer or the hole-transporting layer and electrons injected from the negative electrode, the electron-injecting layer or the electron-transporting layer are recombined to emit light when electric field is applied to the light-emitting device. A light-emitting material for the light-emitting layer are not particularly limited if only they have functions of: receiving the holes provided from the positive electrode, etc.; receiving the electrons provided from the negative electrode, etc.; transporting the charges; and providing the occasion where the holes and the electrons are recombined to emit light when electric field is applied to the light-emitting device. The light-emitting material may be such that utilizes singlet exciton, triplet exciton or both thereof for light emission, and examples thereof include: benzoxazole; benzoimidazole; benzothiazole; styrylbenzene; polyphenyl; diphenylbutadiene; tetraphenylbutadiene; naphthalimido; coumarin; perylene; perynone; oxadiazole; aldazine; pyralidine; cyclopentadiene; bis(styryl)anthracene; quinacridon; pyrrolopyridine; thiadiazolopyridine; cyclopentadiene; styrylamine; aromatic dimethylidine compounds; metal complexes such as 8-quinolinol metal complexes, rare-earth metal complexes and transition metal complexes; high molecular weight light-emitting material such as polythiophene, polyphenylene and polyphenylenevinylene; organic silane compounds; the transition metal complex (1); derivatives thereof; etc.

The light-emitting layer may be made of one material or a plurality of materials. The light-emitting device according to the present invention may comprise one light-emitting layer or a plurality of light-emitting layers. Each of the light-emitting layers may emit light with a different color, to provide white light. The single light-emitting layer may provide white light. In the case where the light-emitting device comprises a plurality of light-emitting layers, each layer may be made of one material or a plurality of materials.

The light-emitting layer may be formed by: a resistance heating vapor deposition method; an electron beam method; a sputtering method; a molecular stacking method; a coating method such as a spin-coating method, a casting method and a dip-coating method; an ink-jet method; a printing method; an LB method; a transferring method; etc. Among the methods, the resistance heating vapor deposition method and the coating method are preferred. Although thickness of the light-emitting layer is not particularly limited, generally, the thickness is preferably 1 nm to 5 µm, more preferably 5 nm to 1 µm, particularly preferably 10 to 500 nm.

(E) Electron-Injecting Layer and Electron-Transporting Layer

The electron-injecting material and the electron-transporting material used for the electron-injecting layer and the electron-transporting layer are not particularly limited if they have any function of: injecting the electrons provided from the negative electrode into the light-emitting layer; transporting the electrons to the light-emitting layer; and blocking the holes provided from the positive electrode. Examples of the electron-injecting material and the electron-transporting material include: triazole; oxazole; oxadiazole; imidazole; fluorenone; anthraquinodimethane; anthrone; diphenylquinone; thiopyran dioxide; carbodimide; fluorenylidenemethane; distyrylpyrazine; anhydrides derived from a tetracarboxylic acid having such a aromatic ring as a naphthalene ring and a perylene ring; phthalocyanine; metal complexes such as 8-quinolinol metal complexes, metal-lophthalocyanines, and metal complexes containing a benzoxazole ligand or a benzothiazole ligand; organic silane compounds; the transition metal complex (1); derivatives thereof; etc.

Each of the electron-injecting layer and the electron-transporting layer may have a structure of single-layer made of one or more materials, or multi-layers made of the same material or different materials. The electron-injecting layer and the electron-transporting layer may be formed by a vacuum deposition method, an LB method, an ink-jet method, a printing method, a transferring method, a coating method using a solution or a dispersion containing the above material such as a spin-coating method, a casting method and a dip-coating method, etc. The solution and the dispersion used in the coating method may contain a resin. Examples of the resin may be the same as those for the hole-injecting layer and the hole-transporting layer. Although thickness of each of the electron-injecting layer and the electron-transporting layer is not particularly limited, generally, the thickness is preferably 1 nm to 5 µm, more preferably 5 nm to 1 µm, particularly preferably 10 to 500 nm.

(F) Protective Layer

The protective layer acts to shield the light-emitting device from penetration of moisture, oxygen, etc. that promotes deterioration of the device. Examples of a material for the protective layer include: metals such as In, Sn, Pb, Au, Cu, Ag, Al, Ti and Ni; metal oxides such as MgO, SiO, $SiO_2$, $Al_2O_3$, GeO, NiO, CaO, BaO, $Fe_2O_3$, $Y_2O_3$ and $TiO_2$; metal fluorides such as $MgF_2$, LiF, $AlF_3$ and $CaF_2$; nitrides such as SiN and $SiN_xO_y$; polyethylene; polypropylene; poly(methylmethacrylate); polyimides; polyureas; polytetrafluoroethylene; polychlorotrifluoroethylene; polydichlorodifluoroethylene; copolymers of chlorotrifluoroethylene ad dichlorodifluoroethylene; copolymers of tetrafluoroethylene and at least one comonomer; fluorine-containing copolymers having a cyclic structure in the main chain; a moisture-absorbing substance having a water absorption of 1% or more; a moisture-resistant substance having a water absorption of 0.1% or less; etc.

The protective layer may be formed by a vacuum deposition method, a sputtering method, an activated sputtering method, a molecular beam epitaxy method (MBE method), a cluster ion beam method, an ion-plating method, a plasma polymerization method, a high frequency excitation ion-plating method, a plasma CVD method, a laser CVD method, a thermal CVD method, a gas source CVD method, a coating method, an ink-jet method, a printing method, a transferring method, etc.

EXAMPLES

The present invention will be explained in further detail by the following Examples without intention of restricting the scope of the present invention defined by the claims attached hereto.

Synthesis Example 1

Synthesis of Transition Metal Complex (1-20)

To a solution prepared by adding 20 ml of chloroform to 0.08 g of a pyridylazole derivative 2 was added 0.08 mil of a methanol solution of $CH_3ONa$ (28 weight %) dropwise, and the resulting solution was stirred at room temperature for 10 minutes. To this solution was added 0.2 g of an iridium complex 1, and the resultant was stirred at the room temperature for 3 hours. The iridium complex 1 may be prepared by a method described in J. Am. Chem. Soc., 1984, 106, 6647. Then, to this were added 50 ml of chloroform and 50 ml of water, and an organic phase and a water phase were separated. The organic phase was dried with sodium sulfate, concentrated and recrystallized from chloroform/methanol, to provide 0.1 g of the transition metal complex (1-20) as a yellow solid. Structure of the product was confirmed by MS spectrum (FAB-MASS spectrum (posi)=695). Thus-obtained transition metal complex (1-20) had a melting point of 220 to 223° C.

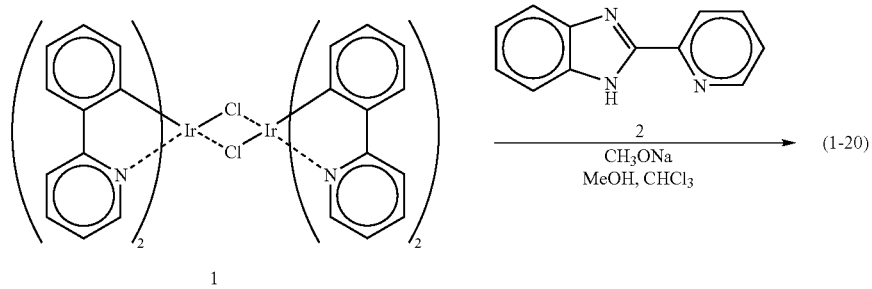

Synthesis Example 2

Synthesis of Transition Metal Complex (1-203)

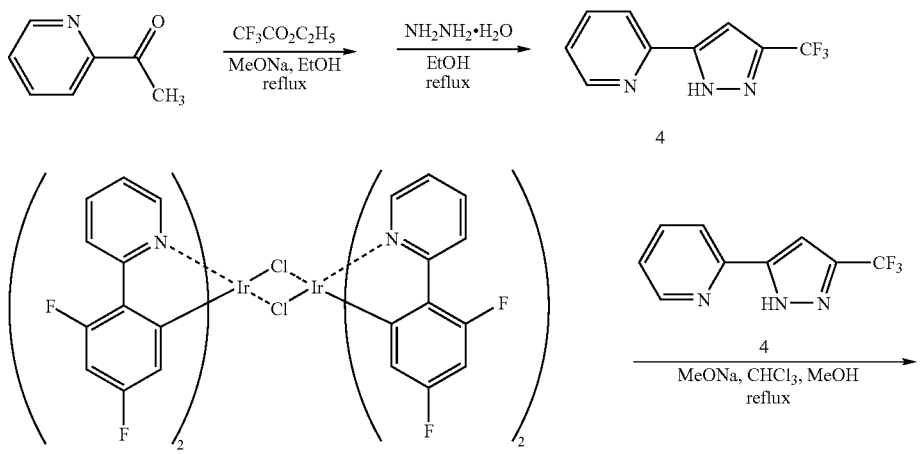

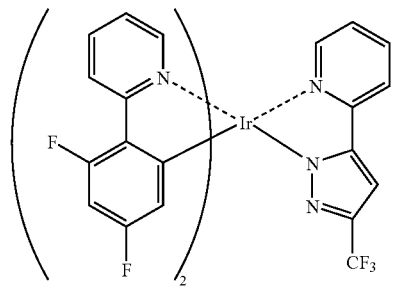

(1-203)

To 11.8 ml of 2-acetylpyridine was added 100 ml of ethanol, and further added 15 g of trifluoroacetoacetic ester. The resulting solution was added 22.4 ml of a methanol solution of MeONa (28 weight %) dropwise to, stirred under reflux for 2 hours, and cooled to the room temperature. To the resulting solution was added 300 ml of ethyl acetate and 300 ml of water, and further added 1 mol/l hydrochloric acid aqueous solution such that water phase exhibited pH of approximately 7. Then, organic phase was separated, washed with 100 ml of water and 100 ml of saturated sodium chloride solution, dried with sodium sulfate and concentrated. Residue was purified by column chromatography (chloroform) to provide a brown liquid. This liquid was dissolved in 50 ml of ethanol, added 7.8 g of hydrazine hydrate to, stirred under reflux for 3 hours, and cooled to the room temperature. To this were added 200 ml of ethyl acetate and 200 ml of water and organic phase and water phase were separated. The organic phase was washed with 100 ml of water and 100 ml of saturated sodium chloride solution, dried with sodium sulfate and concentrated. Residue was purified by column chromatography (chloroform) to provide 5 g of compound 4 as a white solid.

To 0.2 g of compound 3 and 0.1 g of the compound 4 was added 20 ml of chloroform. The resulting solution was added 0.09 ml of a methanol solution of MeONa (28 weight %) dropwise to, stirred under reflux for 3 hours, and cooled to the room temperature. To this were added 50 ml of chloroform and 50 ml of water and organic phase were separated. Thus-obtained organic phase was dried with sodium sulfate and concentrated. Residue was purified by column chromatography (chloroform), recrystallized from chloroform/methanol, to provide 0.15 g of the transition metal complex (1-203) as a yellow solid. Structure of the product was confirmed by MS spectrum.

Synthesis Example 3

Synthesis of Transition Metal Complex (1-262)

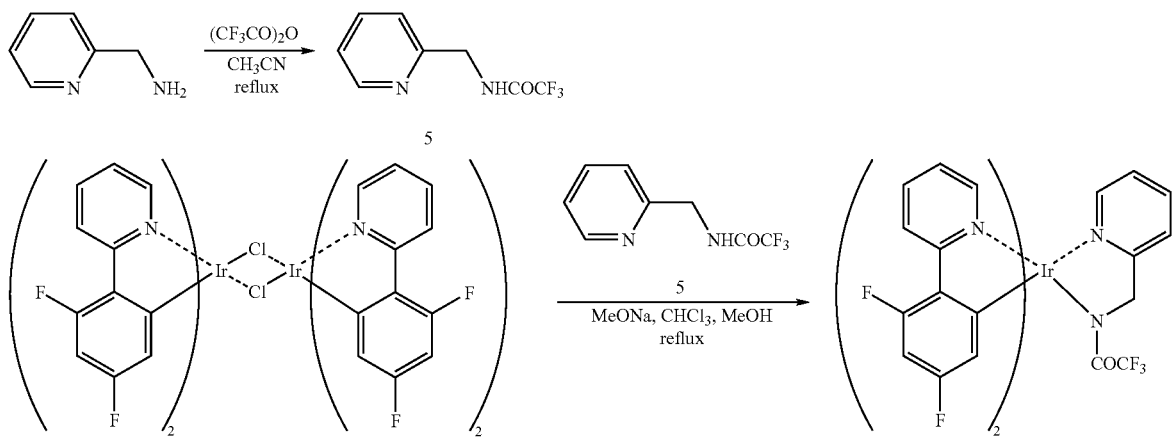

4.2 g of 2-aminomethylpyridine was dissolved in 100 ml of acetonitrile, and to this was added 9.8 ml of trifluoroacetic anhydride dropwise. The resultant solution was stirred at the room temperature for 1 hour, and 400 ml of ethyl acetate and 400 ml of water was added thereto. To thus-obtained solution was added sodium hydrogen carbonate stepwise until foaming was not observed, and organic phase were separated and concentrated to provide 4 g of compound 5 as a brown solid.

To 0.5 g of the compound 3 and 0.23 g of the compound 5 was added 20 ml of chloroform. The resulting solution was added 0.22 ml of a methanol solution of MeONa (28 weight %) dropwise to, stirred under reflux for 1 hour, and cooled to the room temperature. To this were added 50 ml of ethyl acetate and 50 ml of water, and organic phase was separated. Thus-obtained organic phase was dried with sodium sulfate and concentrated. Residue was purified by column chromatography (chloroform) to provide 0.35 g of the transition metal complex (1-262) as a yellow solid. Structure of the product was confirmed by MS spectrum.

Synthesis Example 4

Synthesis of Transition Metal Complex (1-228)

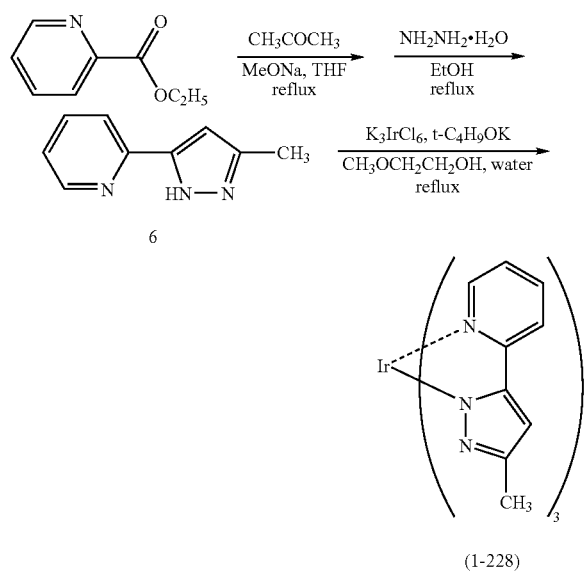

To 10.6 ml of ethyl picolinate was added 100 ml of tetrahydrofuran, and to this was added 4.1 g of acetone. The resulting solution was added 27 ml of a methanol solution of MeONa (28 weight %) dropwise to, stirred under reflux for 3 hours, and cooled to the room temperature. To this were added 300 ml of ethyl acetate and 300 ml of water, and further added 1 mol/l hydrochloric acid aqueous solution such that water phase exhibited pH of approximately 7. Then, organic phase were separated, washed with 100 ml of water and 100 ml of saturated sodium chloride solution, dried with sodium sulfate and concentrated. Residue was purified by column chromatography (chloroform) to provide a brown liquid. This liquid was dissolved in 50 ml of ethanol, added 7 g of hydrazine hydrate to, stirred under reflux for 2 hours, and cooled to the room temperature. To this were added 200 ml of ethyl acetate and 200 ml of water and organic phase and was separated. The organic phase was washed with 100 ml of water and 100 ml of saturated sodium chloride solution, dried with sodium sulfate and concentrated. Residue was subjected to crystallization using hexane/chloroform, to provide 8 g of compound 6 as a waxy solid.

To 0.18 g of the compound 6 were added 10 ml of methoxyethanol and 10 ml of water, and 0.13 g of t-$C_4H_9$OK was added thereto and stirred at the room temperature for 10 minutes. 0.1 g of $K_3IrCl_6$ was added to the resulting solution, stirred under reflux for 4 hours, and cooled to the room temperature. To this were added 50 ml of chloroform and 50 ml of water, and organic phase were separated. Thus-obtained organic phase was dried with sodium sulfate and concentrated. Residue was purified by silica gel column chromatography (chloroform/methanol=10/1) to provide 0.05 g of the transition metal complex (1-228) as a yellow solid. Structure of the product was confirmed by MS spectrum.

Synthesis Example 5

Synthesis of Transition Metal Complex (1-343)

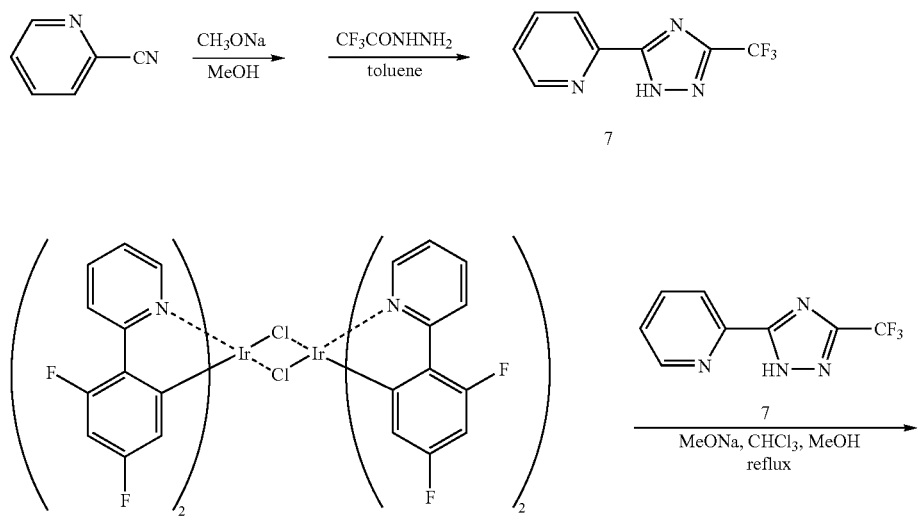

-continued

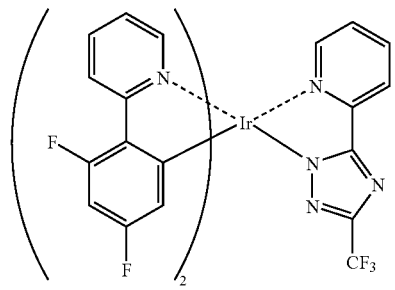

(1-343)

To 10 g of 2-cyanopyridine was added 30 ml of methanol and then added 19.5 ml of a methanol solution of $CH_3ONa$ (28 weight %), and the resulting solution was stirred at the room temperature for 1 hour. 5.5 ml of acetic acid was added to the solution dropwise and stirred for 5 minutes, and 17 g of trifluoroacetohydrazide was added thereto and stirred at the room temperature for 1 hour to precipitate a crystal. The crystal was separated by filtration, to this was added 50 ml of toluene, and the resulting mixture was stirred under reflux for 3 hours. The mixture was then cooled to the room temperature and the solvent was removed to 8.8 g of compound 7.

To 0.2 g of the compound 3 and 0.12 g of the compound 7 was added 20 ml of chloroform. The resulting solution was added 0.11 ml of a methanol solution of MeONa (28 weight %) dropwise to, stirred under reflux for 3 hours, and cooled to the room temperature. To this were added 50 ml of chloroform and 50 ml of water, and organic phase was separated. Thus-obtained organic phase was dried with sodium sulfate and concentrated. Residue was purified by silica gel column chromatography (chloroform), and recrystallized from chloroform/methanol, to provide 0.13 g of the transition metal complex (1-343) as a yellow solid. Structure of the product was confirmed by MS spectrum.

Example 1

1 mg of the transition metal complex (1-20), 40 mg of poly(N-vinylcarbazole) and 12 mg of 2-(4-biphenyl)-5-(4-t-butylphenyl)-1,3,4-oxadiazole (PBD) were dissolved in 2.5 ml of dichloroethane, and the obtained solution was applied to a washed ITO substrate by spin-coating (1500 rpm, 20 sec) to form an organic layer having thickness of 98 nm. Then, on the organic layer was disposed a mask patterned for desired light-emitting area of 4 mm×5 mm, magnesium and silver (mole ratio: magnesium/silver=10/1) was co-deposited on the organic layer into 50 nm in a deposition apparatus, and silver was further deposited thereon into 50 nm, to produce a light-emitting device of Example 1.

Thus-obtained light-emitting device was made to emit light while applying direct current voltage thereto by "Source-Measure Unit 2400" manufactured by TOYO CORPORATION, and measured with respect to luminance by "Luminance Meter BM-8" manufactured by TOPCON CORPORATION. The light-emitting device of Example 1 emitted a green light and exhibited maximum luminance of 6800 $cd/m^2$ and minimum driving voltage of 9 V. Incidentally, in this invention, the "minimum driving voltage" means a minimum valve of driving voltage required by the light-emitting device to emit light. Further, the light-emitting device of Example 1 was left to stand in the air for 1 day, and then, the luminance was measured again to evaluate its durability. As a result, the light-emitting device of Example 1 exhibited the maximum luminance of 5900 $cd/m^2$.

Example 2

A light-emitting device of Example 2 was produced and evaluated with respect to the luminance and the durability in the same manner as Example 1 except for using the transition metal complex (1-22) instead of the transition metal complex (1-20). As a result, the light-emitting device of Example 2 emitted a green light and exhibited the maximum luminance of 3700 $cd/m^2$ and the minimum driving voltage of 9 V. Further, the light-emitting device of Example 2 exhibited the maximum luminance of 2700 $cd/m^2$ after the device was left to stand in the air for 1 day.

Example 3

A light-emitting device of Example 3 was produced and evaluated with respect to the luminance and the durability in the same manner as Example 1 except for using the transition metal complex (1-1) instead of the transition metal complex (1-20). As a result, the light-emitting device of Example 3 emitted a bluish green light and exhibited the maximum luminance of 3400 $cd/m^2$ and the minimum driving voltage of 9 V. Further, the light-emitting device of Example 3 exhibited the maximum luminance of 3000 $cd/m^2$ after the device was left to stand in the air for 1 day.

Comparative Example 1

A light-emitting device of Comparative Example 1 was produced and evaluated with respect to the luminance and the durability in the same manner as Example 1 except for using the following compound A instead of the transition metal complex (1-20). As a result, the light-emitting device of Comparative Example 1 emitted a green light and exhibited the maximum luminance of 3300 $cd/m^2$ and the minimum driving voltage of 11 V. Further, the light-emitting device of Comparative Example 1 exhibited the maximum luminance of 410 $cd/m^2$ after the device was left to stand in the air for 1 day.

Compound A

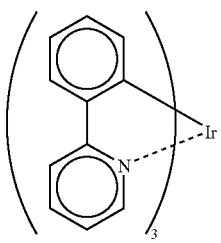

Comparative Example 2

A washed ITO substrate was placed in a deposition apparatus, N,N'-diphenyl-N,N'-di(m-tolyl)benzidine (TPD) was deposited on the ITO substrate into a thickness of 50 nm, the compound A and the following compound B (weight ratio: compound A/compound B=1/17) were co-deposited thereon into 36 nm, and further, thereon was deposited the following azole compound C into 36 nm. On thus-obtained organic layer was disposed a mask patterned for desired light-emitting area of 4 mm×5 mm, lithium fluoride was deposited on the organic layer into 3 nm in a deposition apparatus, and aluminum was further deposited thereon into 60 nm, to produce a light-emitting device of Comparative Example 2.

Thus-obtained light-emitting device was made to emit light while applying direct current voltage thereto by "Source-Measure Unit 2400" manufactured by TOYO CORPORATION, and measured with respect to luminance and emission wavelength. The luminance was measured by "Luminance Meter BM-8" manufactured by TOPCON CORPORATION and the emission wavelength was measured by "Spectral Analyzer PMA-11" manufactured by Hamamatsu Photonics K.K. As a result, the light-emitting device of Comparative Example 2 emitted a green light with $EL_{max}$ of 518 nm and chromaticity of (0.31, 0.61), and exhibited external quantum efficiency of 7.2%. Incidentally, the external quantum efficiency was obtained by the luminance, emission spectrum, current density and luminosity curve.

Compound B

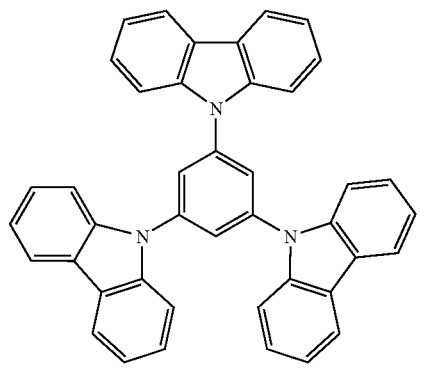

Compound C

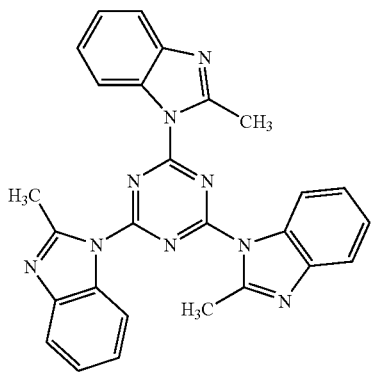

Example 4

A light-emitting device of Example 4 was produced and evaluated with respect to the luminance and the external quantum efficiency (light-emitting efficiency) in the same manner as Comparative Example 2 except for using the transition metal complex (1-201) instead of the compound A. As a result, the light-emitting device of Example 4 emitted a blue light with $EL_{max}$ of 470 nm and chromaticity of (0.16, 0.34), and exhibited external quantum efficiency of 8.0%.

Example 5

A light-emitting device of Example 5 was produced and evaluated with respect to the luminance and the external quantum efficiency in the same manner as Comparative Example 2 except for using the transition metal complex (1-203) instead of the compound A. As a result, the light-emitting device of Example 5 emitted a blue light with $EL_{max}$ of 463 nm and chromaticity of (0.17, 0.28), and exhibited external quantum efficiency of 8.0%.

Example 6

A light-emitting device of Example 6 was produced and evaluated with respect to the luminance and the external quantum efficiency in the same manner as Comparative Example 2 except for using the transition metal complex (1-262) instead of the compound A. As a result, the light-emitting device of Example 6 emitted a blue light with $EL_{max}$ of 469 nm and chromaticity of (0.17, 0.36), and exhibited external quantum efficiency of 7.0%.

Example 7

A washed ITO substrate was placed in a deposition apparatus, N,N'-diphenyl-N,N'-di(m-tolyl)benzidine (TPD) was deposited on the ITO substrate into a thickness of 50 nm, the following compound D and the following compound E (weight ratio: compound D/compound E=1/17) were co-deposited thereon into 18 nm, the transition metal complex (1-203) and the compound B (weight ratio: transition metal complex (1-203)/compound B=1/17) were co-deposited thereon into 18 nm, and further, thereon was deposited the azole compound C into 36 nm. On thus-obtained organic layer was disposed a mask patterned for desired light-emitting area of 4 mm×5 mm, lithium fluoride was deposited on the organic layer into 3 nm in a deposition apparatus, and aluminum was further deposited thereon into 60 nm, to produce a light-emitting device of Example 7. The light-emitting device of Example 7 was evaluated with respect to the luminance and the external quantum efficiency in the same manner as Comparative Example 2. As a result, the light-emitting device of Example 7 emitted a white light with chromaticity of (0.33, 0.30), and exhibited external quantum efficiency of 8.1%.

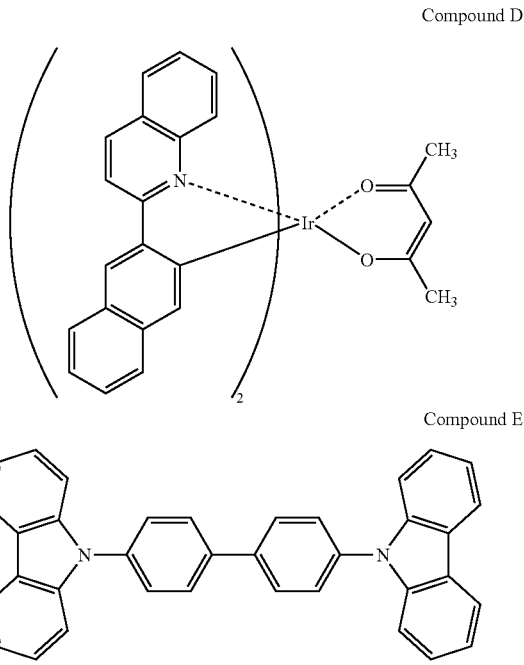

Example 8

A light-emitting device of Example 8 was produced and evaluated with respect to the luminance and the external quantum efficiency in the same manner as Comparative Example 2 except that the transition metal complex (1-208) was used instead of the compound A and that the transition metal complex (1-208) and the compound B was co-deposited at weight ratio of transition metal complex (1-208)/compound B=2/17. As a result, the light-emitting device of Example 8 emitted a blue light with $EL_{max}$ of 462 nm and chromaticity of (0.15, 0.29), and exhibited external quantum efficiency of 6.5%.

Example 9

A light-emitting device of Example 9 was produced and evaluated with respect to the luminance and the external quantum efficiency in the same manner as Comparative Example 2 except that the transition metal complex (1-209) was used instead of the compound A and that the transition metal complex (1-209) and the compound B was co-deposited at weight ratio of transition metal complex (1-209)/compound B=2/17. As a result, the light-emitting device of Example 9 emitted a blue light with $EL_{max}$ of 456 nm and chromaticity of (0.15, 0.24), and exhibited external quantum efficiency of 3.2%.

Example 10

A light-emitting device of Example 10 was produced and evaluated with respect to the luminance and the external quantum efficiency in the same manner as Comparative Example 2 except that the transition metal complex (1-343) was used instead of the compound A and that the transition metal complex (1-343) and the compound B was co-deposited at weight ratio of transition metal complex (1-343)/compound B=2/17. As a result, the light-emitting device of Example 10 emitted a blue light with $EL_{max}$ of 462 nm and chromaticity of (0.15, 0.29), and exhibited external quantum efficiency of 8.1%.

Example 11

A light-emitting device of Example 11 was produced and evaluated with respect to the luminance and the external quantum efficiency in the same manner as Comparative Example 2 except that the transition metal complex (1-344) was used instead of the compound A and that the transition metal complex (1-344) and the compound B was co-deposited at weight ratio of transition metal complex (1-344)/compound B=2/17. As a result, the light-emitting device of Example 11 emitted a blue light with $EL_{max}$ of 453 nm and chromaticity of (0.15, 0.21), and exhibited external quantum efficiency of 1.3%.

Example 12

A light-emitting device of Example 12 was produced and evaluated with respect to the luminance and the external quantum efficiency in the same manner as Comparative Example 2 except that the transition metal complex (1-360) was used instead of the compound A and that the transition metal complex (1-360) and the compound B was co-deposited at weight ratio of transition metal complex (1-360)/compound B=2/17. As a result, the light-emitting device of Example 12 emitted a blue light with $EL_{max}$ of 453 nm and chromaticity of (0.15, 0.27), and exhibited external quantum efficiency of 5.1%.

Example 13

A light-emitting device of Example 13 was produced and evaluated with respect to the luminance and the external quantum efficiency in the same manner as Comparative Example 2 except for using the transition metal complex (1-352) instead of the compound A. As a result, the light-emitting device of Example 13 emitted a blue light.

Example 14

A light-emitting device of Example 14 was produced and evaluated with respect to the luminance and the external quantum efficiency in the same manner as Comparative Example 2 except for using the transition metal complex (1-228) instead of the compound A. As a result, the light-emitting device of Example 14 emitted a bluish green light.

As described in detail above, the light-emitting device of the present invention using the transition metal complex (1) can emit a light of blue, white, etc. with high luminance and light-emitting efficiency, and exhibits low minimum driving voltage and excellent durability. In this invention, a blue light-emitting device having a small chromaticity difference and high light-emitting efficiency can be obtained by using the transition metal complex (1). Thus, the light-emitting device according to the present invention can be preferably used for indicating elements, display devices, backlights, electro-photographies, illumination light sources, recording light sources, exposing light sources, reading light sources, road signs or markings, signboards, interiors, optical communications, etc. The transition metal complex (1) is usable for the light-emitting device and has a wide applicability for medical treatments, fluorescent whitening agents, photographic materials, UV-absorbing materials, laser dyes, dyes for color filters, color conversion filters, etc.

What is claimed is:

1. A light-emitting device comprising a pair of electrodes and one or more organic layers disposed between said electrodes, said one or more organic layers comprising a light-emitting layer, wherein at least one of said one or more organic layers comprises a transition metal complex containing a moiety represented by the following formula (3):

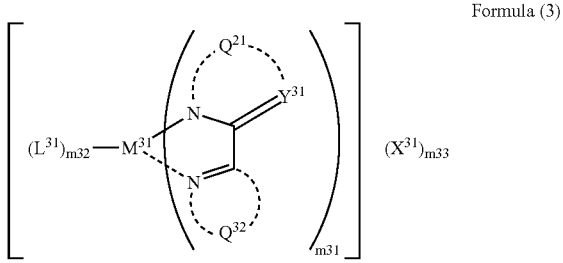

Formula (3)

wherein $M^{31}$ represents a transition metal ion; $Y^{31}$ represents a nitrogen atom or a substituted or unsubstituted carbon atom; $Q^{31}$ and $Q^{32}$ represent an atomic group forming a nitrogen-containing heterocyclic ring, respectively; $L^{31}$ represents a ligand; $X^{31}$ represents a counter ion; m31 represents an integer of 1 to 4; m32 represents an integer of 0 to 3; and m33 represents an integer of 0 to 4.

2. The light-emitting device according to claim 1, wherein said transition metal complex is represented by the following formula (6):

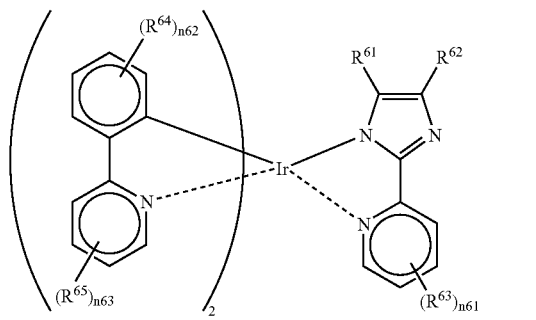

Formula (6)

wherein $R^{61}$ and $R^{62}$ represent a hydrogen atom or a substituent, respectively; $R^{63}$, $R^{64}$ and $R^{65}$ represent a substituent, respectively; and n61, n62 and n63 represent an integer of 0 to 4, respectively.

3. The light-emitting device according to claim 1, wherein said transition metal complex is represented by the following formula (13):

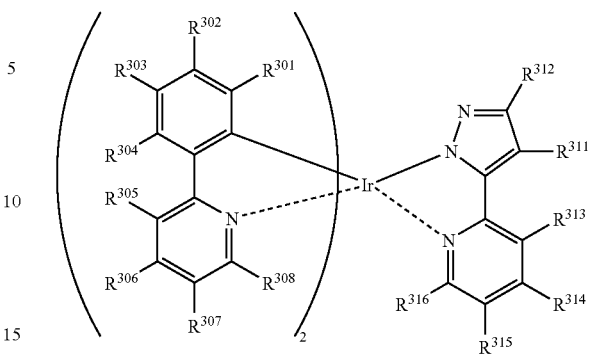

Formula (13)

wherein $R^{301}$, $R^{302}$, $R^{303}$, $R^{304}$, $R^{305}$, $R^{306}$, $R^{307}$, $R^{308}$, $R^{311}$, $R^{312}$, $R^{313}$, $R^{314}$, $R^{315}$ and $R^{316}$ represent a hydrogen atom or a substituent, respectively.

4. The light-emitting device according to claim 1, wherein said transition metal complex is represented by the following formula (19):

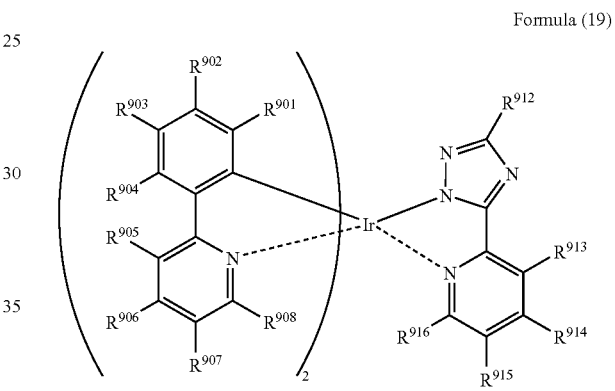

Formula (19)

wherein $R^{901}$, $R^{902}$, $R^{903}$, $R^{904}$, $R^{905}$, $R^{906}$, $R^{907}$, $R^{908}$, $R^{912}$, $R^{913}$, $R^{914}$, $R^{915}$ and $R^{916}$ represent a hydrogen atom or a substituent, respectively, $R^{901}$, $R^{902}$, $R^{903}$, $R^{904}$, $R^{905}$, $R^{906}$, $R^{907}$, $R^{908}$, $R^{912}$, $R^{913}$, $R^{914}$, $R^{915}$, and $R^{916}$ being free of a transition metal ion or a transition metal atom.

5. The light-emitting device according to claim 1, wherein said transition metal complex is represented by the following formula (20):

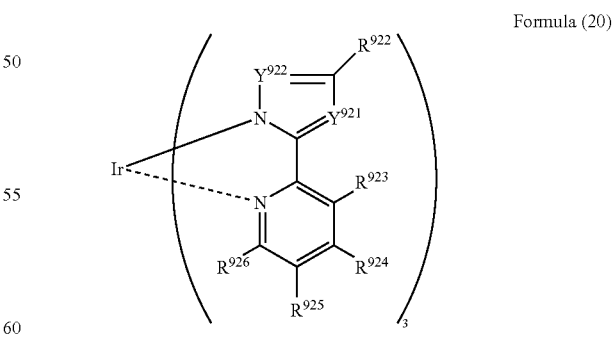

Formula (20)

wherein $Y^{921}$ and $Y^{922}$ represent a nitrogen atom or a substituted or unsubstituted carbon atom, respectively; and $R^{922}$, $R^{923}$, $R^{924}$, $R^{925}$ and $R^{926}$ represent a hydrogen atom or a substituent, respectively.

* * * * *

UNITED STATES PATENT AND TRADEMARK OFFICE
CERTIFICATE OF CORRECTION

PATENT NO. : 7,329,898 B2
APPLICATION NO. : 11/101555
DATED : February 12, 2008
INVENTOR(S) : Tatsuya Igarashi Page 1 of 1

It is certified that error appears in the above-identified patent and that said Letters Patent is hereby corrected as shown below:

Claim 1, line 7, the formula should be delete (this corresponds to col. 83, lines 20-33 of the patent) and inserted as identified below.

" 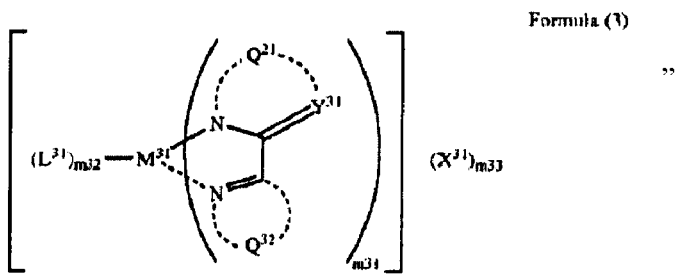 "

Insert:

-- 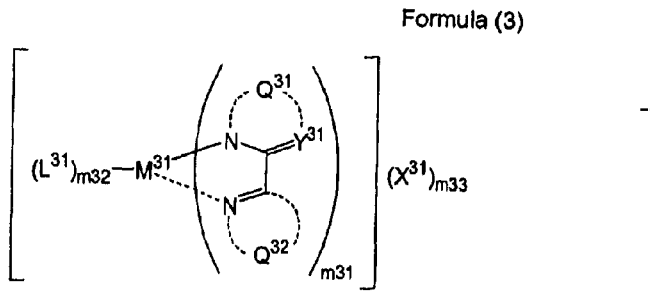 --

Signed and Sealed this

Fifth Day of August, 2008

JON W. DUDAS
*Director of the United States Patent and Trademark Office*

UNITED STATES PATENT AND TRADEMARK OFFICE
CERTIFICATE OF CORRECTION

PATENT NO. : 7,329,898 B2  Page 1 of 1
APPLICATION NO. : 11/101555
DATED : February 12, 2008
INVENTOR(S) : Tatsuya Igarashi It is certified that error appears in the above-identified patent and that said Letters Patent is hereby corrected as shown below:

Title Page; The left column, counting (12) United States Patent as line 1, "US 2005/0238916A1 Oct. 27, 2005" as line 13 and "(51) Int. Cl." as line 14, between lines 13 and 14, please insert the following:

--Related U.S. Application Data
(63) Division of application No. 10/059,109, filed on Jan. 31, 2002,
      now Pat. No. 6,911,677.

(30)        Foreign Application Priority Data

Feb. 1, 2001   (JP).............................2001-26046
Aug. 17, 2001 (JP).............................2001-248165
Jan. 10, 2002  (JP)...........................2002-003832--

Column 1, immediately following line 2 which reads "LIGHT-EMITTING DEVICE" and before line 4 which reads "FIELD OF THE INVENTION" please insert the following

--CROSS-REFERENCE TO RELATED APPLICATION

Division of application No. 10/059,109, filed on Jan. 31, 2002, now Pat. No. 6,911,677.--

Signed and Sealed this

Thirtieth Day of March, 2010

David J. Kappos
*Director of the United States Patent and Trademark Office*